(12) United States Patent
Choi et al.

(10) Patent No.: US 12,526,975 B2
(45) Date of Patent: Jan. 13, 2026

(54) SEMICONDUCTOR MEMORY DEVICE WITH MOLD INSULATING PATTERNS, SEMICONDUCTOR PATTERNS, AND GATE ELECTRODES

(71) Applicant: Samsung Electronics Co., Ltd., Suwon-si (KR)

(72) Inventors: Hyun Geun Choi, Suwon-si (KR); Ki Seok Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 507 days.

(21) Appl. No.: 17/933,875

(22) Filed: Sep. 21, 2022

(65) Prior Publication Data

US 2023/0180455 A1 Jun. 8, 2023

(30) Foreign Application Priority Data

Dec. 2, 2021 (KR) .......................... 10-2021-0170881

(51) Int. Cl.
*H10B 12/00* (2023.01)
(52) U.S. Cl.
CPC .............. *H10B 12/30* (2023.02); *H10B 12/02* (2023.02); *H10B 12/48* (2023.02); *H10B 12/482* (2023.02)
(58) Field of Classification Search
CPC ........ H10B 12/00; H10B 12/02; H10B 12/30; H10B 12/48; H10B 12/482
See application file for complete search history.

(56) References Cited

U.S. PATENT DOCUMENTS

| | | | |
|---|---|---|---|
| 10,607,995 B2 | 3/2020 | Roberts et al. | |
| 10,784,272 B2 | 9/2020 | Lee et al. | |
| 11,700,723 B2 * | 7/2023 | Jung | H10B 12/30 |
| | | | 257/296 |
| 11,825,643 B2 * | 11/2023 | Ryu | H10D 86/80 |
| 2020/0083225 A1 | 3/2020 | Ma et al. | |
| 2020/0202900 A1 | 6/2020 | Kang et al. | |
| 2020/0279601 A1 | 9/2020 | Kim et al. | |

(Continued)

FOREIGN PATENT DOCUMENTS

| | | | | |
|---|---|---|---|---|
| CN | 114256242 A | * | 3/2022 | ............. H10B 12/30 |
| JP | 2020141129 A | | 9/2020 | |

(Continued)

*Primary Examiner* — Matthew E Warren
(74) *Attorney, Agent, or Firm* — Wolf, Greenfield & Sacks, P.C.

(57) ABSTRACT

According to some embodiments of the present inventive concept, a semiconductor memory device includes a plurality of mold insulating layers on a substrate and spaced apart from one another, a plurality of semiconductor patterns which are between respective ones of the plurality of mold insulating layers adjacent to each other, a plurality of gate electrodes, on respective ones of the plurality of semiconductor patterns, an information storage element which includes a first electrode electrically connected to each of the plurality of semiconductor patterns, a second electrode on the first electrode, and a capacitor dielectric film between the first electrode and the second electrode, a bit line on the substrate and contacts the semiconductor pattern, and an insulating buffer film between the first electrodes and the second electrode and on a sidewall of a respective one of the plurality of mold insulating layers.

15 Claims, 29 Drawing Sheets

(56) References Cited

U.S. PATENT DOCUMENTS

| | | | |
|---|---|---|---|
| 2020/0411523 A1* | 12/2020 | Shin | H10B 12/02 |
| 2021/0013210 A1 | 1/2021 | Lee et al. | |
| 2021/0257366 A1* | 8/2021 | Lee | H10B 12/50 |
| 2021/0257368 A1 | 8/2021 | Jung et al. | |
| 2022/0173106 A1 | 6/2022 | Choi et al. | |

FOREIGN PATENT DOCUMENTS

| | | |
|---|---|---|
| KR | 20210042225 A | 4/2021 |
| KR | 20210077098 A | 6/2021 |
| KR | 20210105594 A | 8/2021 |

* cited by examiner

SEMICONDUCTOR MEMORY DEVICE WITH MOLD INSULATING PATTERNS, SEMICONDUCTOR PATTERNS, AND GATE ELECTRODES

CROSS-REFERENCE TO RELATED APPLICATION

This application claims priority under 35 U.S.C. § 119 from Korean Patent Application No. 10-2021-0170881 Filed on Dec. 2, 2021 in the Korean Intellectual Property Office, the disclosure of which is incorporated herein by reference in its entirety.

BACKGROUND

The present disclosure relates to a semiconductor memory device.

In the case of a conventional two-dimensional or planar semiconductor element, the degree of integration is mainly determined by an area occupied by a unit memory cell, and is therefore affected by the level of fine pattern forming technology. However, since ultra-expensive apparatuses may be needed to miniaturize the pattern, the degree of integration of the two-dimensional semiconductor element is increasing, but is still limited. As a result, three-dimensional semiconductor memory elements including memory cells arranged three-dimensionally have been proposed.

SUMMARY

Aspects of the present disclosure provide a semiconductor memory device having improved electrical characteristics and reliability.

According to some embodiments of the present inventive concept, a semiconductor memory device includes a plurality of mold insulating layers on a substrate and spaced apart from one another in a first direction perpendicular to an upper side of the substrate, a plurality of semiconductor patterns which are between respective ones of the plurality of mold insulating layers adjacent to each other in the first direction, and extend in a second direction parallel to the upper side of the substrate, a plurality of gate electrodes that extend in a third direction different from the first direction and the second direction, on respective ones of the plurality of semiconductor patterns, an information storage element which includes a first electrode electrically connected to each of the plurality of semiconductor patterns, a second electrode on the first electrode, and a capacitor dielectric film between the first electrode and the second electrode, a bit line extending in the first direction and connected to the semiconductor pattern, on the substrate, and an insulating buffer film between the first electrodes and the second electrode. The insulating buffer film is on a sidewall of a respective one of the plurality of mold insulating layers.

According to some embodiments of the present inventive concept, A semiconductor memory device includes a plurality of mold insulating layers on a substrate and spaced apart from one another in a first direction perpendicular to an upper side of the substrate, a bit line that extends in the first direction on the substrate, a semiconductor pattern between ones of the mold insulating layers adjacent to each other in the first direction, contacts the bit line, and extends in a second direction parallel to the upper side of the substrate, a gate electrode which extends in a third direction different from the second direction and is on both side surfaces in the first direction of the semiconductor pattern, and an information storage element on the gate electrode and the semiconductor pattern, and has a first electrode that has a U shape, a second electrode on the first electrode, and a capacitor dielectric film between the first electrode and the second electrode. The second electrode is on inner walls of the first electrode and is not on outer walls of the first electrode in the third direction.

According to some embodiments of the present inventive concept, a semiconductor memory device includes a plurality of mold insulating layers on a substrate and spaced apart from one another in a first direction perpendicular to an upper side of the substrate, a plurality of semiconductor patterns which are between ones of the plurality of mold insulating layers adjacent to each other in the first direction, and extend in a second direction parallel to the upper side of the substrate, a plurality of gate electrodes which extend in a third direction different from the first direction and the second direction, and include a first gate electrode on a first side in the first direction of a respective one of the plurality of semiconductor patterns, and a second gate electrode on a second side opposite to the first side of the respective one of the plurality of semiconductor patterns in the first direction, an information storage element which includes a first electrode electrically connected to each of the plurality of semiconductor patterns, a second electrode on the first electrode, and a capacitor dielectric film between the first electrode and the second electrode, a bit line on the substrate that extends in the first direction and contacts each of the plurality of semiconductor patterns, and an insulating buffer film between the first electrodes and the second electrode, on a respective one of the plurality of mold insulating layers. The first electrode has a cylinder shape, and the second electrode is in an interior of the cylinder shape of the first electrode.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof referring to the attached drawings, in which.

DETAILED DESCRIPTION OF THE EMBODIMENTS

Figure 1:
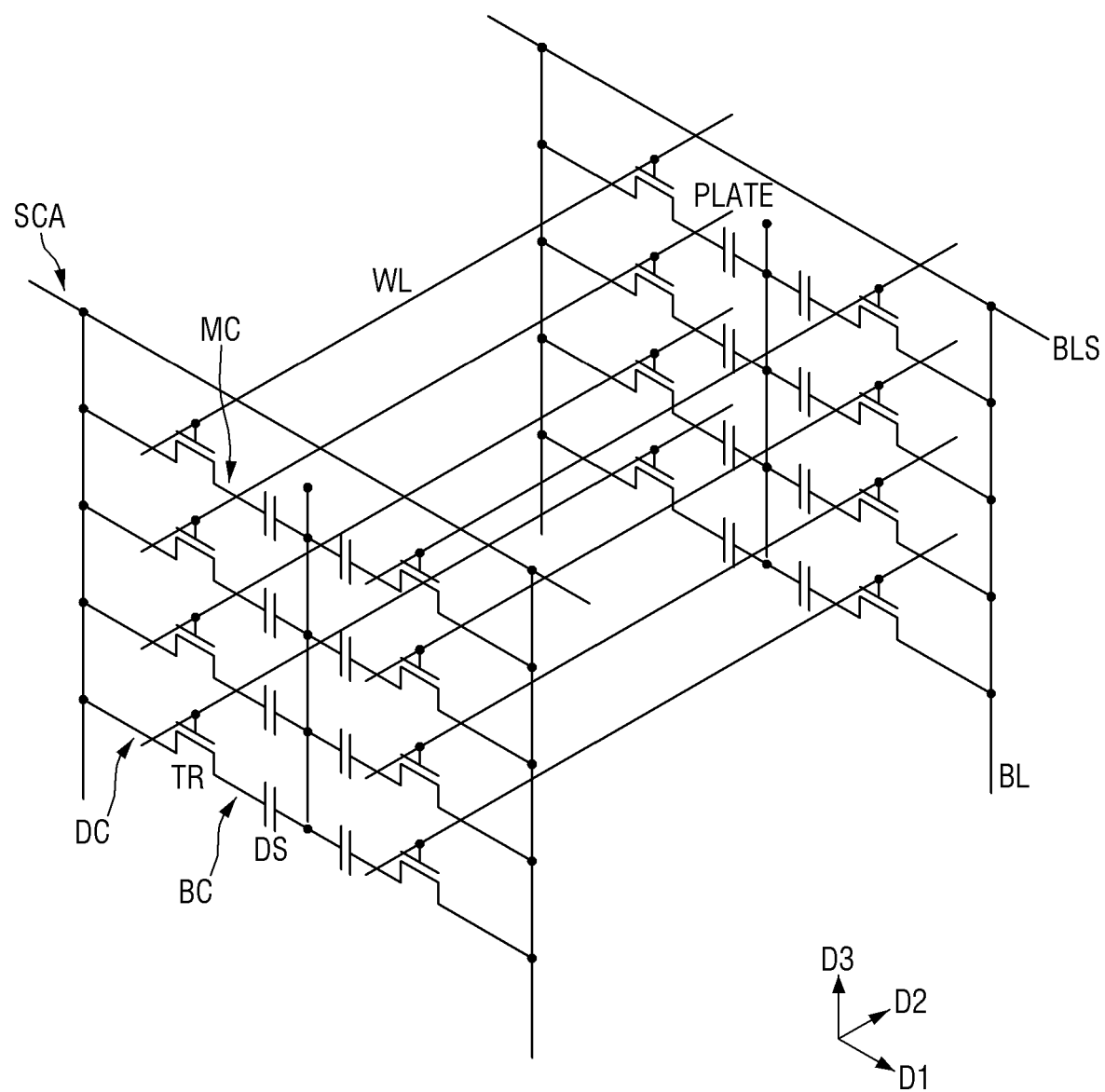
FIG. 1 is an example circuit diagram which shows a cell array of a semiconductor memory device according to some embodiments.

FIG. 1 is an example circuit diagram which shows the cell array of the semiconductor memory device according to some embodiments.

Referring to FIG. 1, a cell array 10 of the semiconductor memory device according to some embodiments may include a plurality of sub-cell arrays SCA. The sub-cell arrays SCA may be arranged along a second direction D2.

Each sub-cell arrays SCA may include a plurality of memory cells MC arranged along a first direction D1 and a third direction D3. Each memory cell MC may include a cell transistor TR and an information storage element DS that are disposed along the first direction D1 and connected to each other.

Bit lines BL may be conductive patterns (e.g., a metal conductive line) extending in a direction perpendicular to the substrate (i.e., the third direction D3). The bit lines BL in one sub-cell array SCA may be arranged in the first direction D1. The bit lines BL adjacent to each other may be spaced apart from each other in the first direction D1.

In some embodiments, some of the plurality of bit lines BLs may be connected to each other by a bit line strapping line (BLS) extending along a first horizontal direction (the direction D1). For example, the bit line strapping line (BLS) may connect the bit lines BL arranged along the first direction D1 to each other among the plurality of bit lines BL.

Word lines WL may be conductive patterns (for example, a metal conductive line) stacked on the substrate in the third direction D3. Each word line WL may extend in the second direction D2. The word lines WL adjacent to each other may be spaced apart from each other in the third direction D3.

The information storage element DS may be commonly connected to an upper electrode PLATE extending in the second direction D2 and the third direction D3. In some embodiments, the upper electrode PLATE arranged along the second direction D2 may be integrated.

The information storage element DS and the memory cell transistor TR arranged along the first direction D1 may be disposed symmetrically, on the basis of planes extending in the second direction D2 and the third direction D3 in which the upper electrode PLATE is disposed.

A gate of the memory cell transistor TR may be connected to the word line WL, and a first source/drain of the memory cell transistor TR may be connected to the bit line BL through a direct contact DC. The first source/drain of the memory cell transistor TR may be connected to the information storage element DS through a buried contact BC. For example, the information storage element DS may be a capacitor. A second source/drain of the memory cell transistor TR may be connected to a lower electrode of the capacitor.

Figure 2:
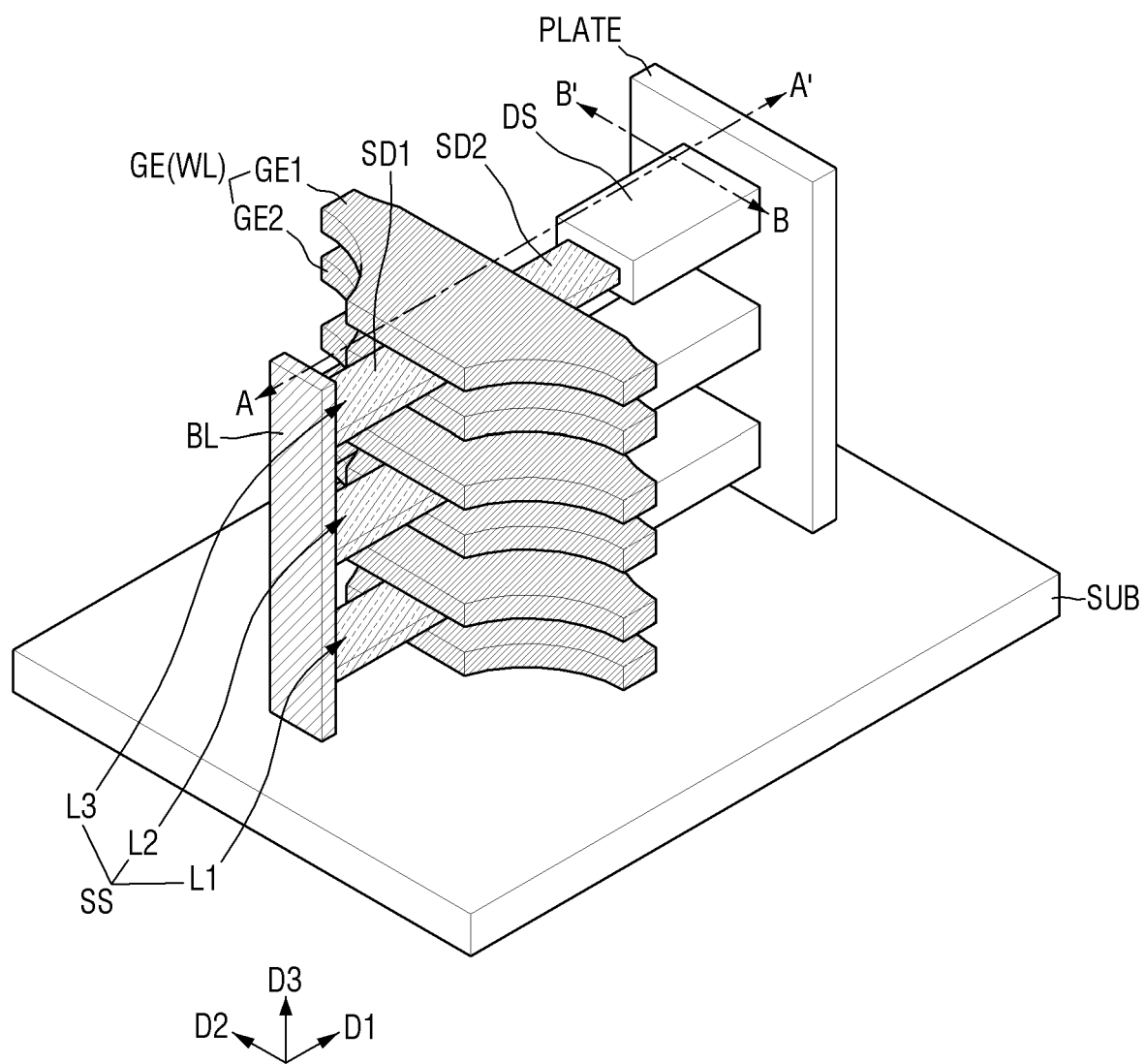
FIGS. 2 and 3 are perspective views of the semiconductor memory device according to some embodiments.
Figure 3:
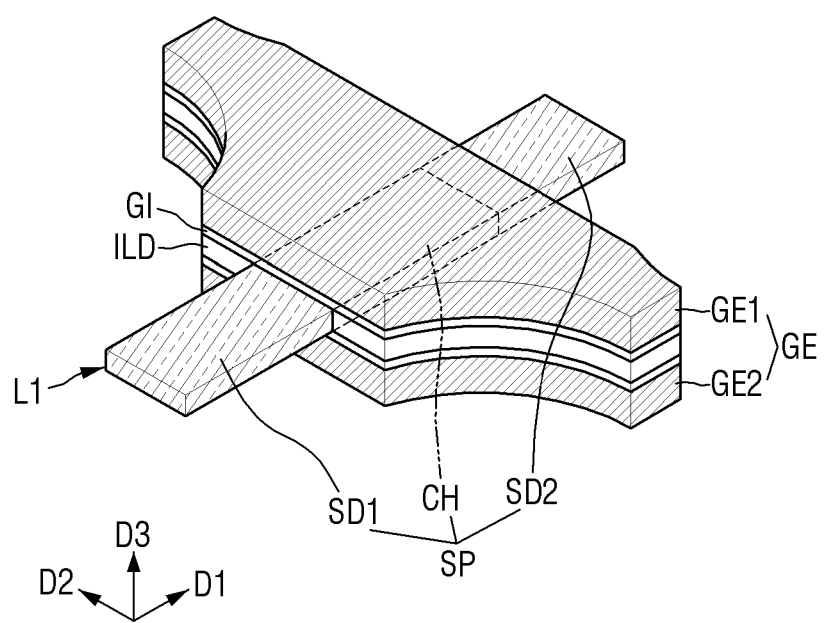

FIGS. 2 and 3 are perspective views of the semiconductor memory device according to some embodiments. FIG. 3 is a diagram showing only the first layer L1 and the gate electrode GE in FIG. 2.

Referring to FIGS. 1 to 3, one of the plurality of sub-cell arrays SCA described using FIG. 1 may be disposed on the substrate SUB.

The substrate SUB may be bulk silicon or silicon-on-insulator (SOI). In contrast, the substrate SUB may be a silicon substrate, or may include, but is not limited to, other materials, for example, silicon germanium, silicon germanium on-insulator (SGOI), indium antimonide, lead tellurium compounds, indium arsenide, indium phosphate, gallium arsenide or gallium antimonide. In the following description, the substrate SUB will be described as a substrate including silicon.

The stacked structure SS including first to third layers L1, L2, and L3 may be disposed on the substrate SUB. The first to third layers L1, L2, and L3 of the stacked structure SS may be stacked apart from each other in the direction perpendicular to an upper side of the substrate SUB (that is, the third direction D3). In some embodiments, the first to third layers L1, L2, and L3 of the stacked structure SS may be stacked apart from each other in the direction perpendicular to the upper side of the substrate SUB (that is, the third direction D3).

Each of the first to third layers L1, L2, and L3 may include a plurality of semiconductor patterns SP, a plurality of information storage elements DS, and a gate electrode GE.

The semiconductor pattern SP may have a line or bar shape extending in the first direction D1. The semiconductor pattern SP may include semiconductor materials such as silicon, germanium, or silicon-germanium. As an example, the semiconductor pattern SP may include at least one of polysilicon, polysilicon germanium, monocrystalline silicon, or monocrystalline silicon-germanium.

Each semiconductor pattern SP may include a channel region CH, a first impurity region SD1, and a second impurity region SD2. The channel region CH may be interposed between the first and second impurity regions SD1 and SD2. The channel region CH may correspond to a channel of the memory cell transistor TR described referring to FIG. 1. The first and second impurity regions SD1 and SD2 may correspond to each of the first source/drain and the second source/drain of the memory cell transistor TR described referring to FIG. 1.

The first and second impurity regions SD1 and SD2 may be regions in which impurities are doped in the semiconductor pattern SP. Therefore, the first and second impurity regions SD1 and SD2 may have an n-type or p-type conductivity type. The first impurity region SD1 may be formed to be adjacent to a first end of the semiconductor pattern SP, and the second impurity region SD2 may be formed to be adjacent to a second end of the semiconductor pattern SP1. The second end may be opposite to the first end in the second direction D2.

The first impurity region SD1 may be formed to be adjacent to the bit line BL. The first impurity region SD1 may be physically and/or electrically connected to the bit line BL. The second impurity region SD2 may be formed to be adjacent to the information storage element DS. The second impurity region SD2 may be physically and/or electrically connected to the information storage element DS.

The information storage element DS may be memory elements that may store data. Each information storage element DS may be a memory element using a capacitor, a memory element using a magnetic tunnel junction pattern, or a memory element using a variable resistor including a phase change material.

The gate electrode GE may have a line shape or a bar shape extending in the second direction D2. The gate electrodes GE may be stacked apart from each other along the third direction D3. Each gate electrode GE may extend in the second direction D2 across the semiconductor pattern SP in the single layer. The gate electrode GE may be word lines WL described referring to FIG. 1.

In some embodiments, the gate electrode GE may include a first gate electrode GE1 disposed on the upper side in the third direction D3 of the semiconductor pattern SP and a second gate electrode GE2 disposed on the lower side in the third direction D3 of the semiconductor pattern SP. The memory cell transistor TR may be a double gate transistor in which gate electrodes GE are provided on both sides of the channel region CH.

In some embodiments, the gate electrode GE may have a T shape in a cross section including the first direction D1 and the second direction D2. The gate electrode GE may include a portion in which a width in the second direction D2 increases toward the information storage element DS. Outer walls of the portion in the second direction D2 may be, for example, convex toward the gate electrode GE.

The gate electrode GE may include a conductive material. As an example, the gate electrode GE may include, but is not limited to, at least one of a doped semiconductor material (doped silicon, doped silicon-germanium, doped germanium, etc.), conductive metal nitride (titanium nitride, tantalum nitride, etc.), metal (tungsten, titanium, tantalum, etc.), or metal-semiconductor compounds (tungsten silicide, cobalt silicide, titanium silicide, etc.).

A plurality of bit lines BL extending in the vertical direction (that is, the third direction D3) may be provided on the substrate SUB. Each bit line BL may have a line shape or column shape extending in the third direction D3. The bit line BL may be arranged along the second direction D2. Each bit line BL may be electrically connected to the first impurity region SD1 of the vertically stacked semiconductor pattern SP.

The bit line BL may include a conductive material, and may include, for example, but is not limited to, at least one of a doped semiconductor material such as impurity-doped silicon and/or an impurity-doped germanium, a conductive metal nitride such as titanium nitride and/or tantalum nitride, a metal such as tungsten, titanium and/or tantalum, and/or a metal-semiconductor compound such as tungsten silicide, cobalt silicide and/or titanium silicide. The bit line BL may be the bit line BL described referring to FIG. 1.

In some embodiments, the bit line BL may include a barrier film that is in contact with the first impurity region SD1, and a filling layer that covers or overlaps the barrier film. The barrier film may include, for example, a metal, a conductive metal nitride, a conductive metal silicide or a combination thereof. The filling film may include, for example, doped silicon, Ru, RuO, Pt, PtO, Ir, IrO, SRO (SrRuO), BSRO((Ba,Sr)RuO), CRO(CaRuO), BaRuO, La(Sr,Co)O, Ti, TiN, W, WN, Ta, TaN, TiAlN, TiSiN, TaAlN, TaSiN or a combination thereof.

Among the first to third layers L1, L2, and L3, the first layer L1 will be representatively described in detail. The semiconductor patterns SP of the first layer L1 may be arranged in the first direction D1. The semiconductor patterns SP of the first layer L1 may be located at the same level as each other. The gate electrode GE of the first layer L1 may extend in the first direction D1 across the semiconductor pattern SP of the first layer L1. For example, the gate electrode GE of the first layer L1 may be provided on the upper side and the lower side in the third direction D3 of the semiconductor pattern SP1.

A gate insulating film GI may be interposed between the gate electrode GE and the channel region CH. The gate insulating film GI may include at least one of a high dielectric constant insulating film, a silicon oxide film, a silicon nitride film, and/or a silicon oxynitride film. As an example, the high dielectric constant insulating film may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

Each bit line BL is connected to the first end of the semiconductor pattern SP of the first layer L1. As an example, the bit line BL may be directly connected to the first impurity region SD1. As another example, the bit line BL may be electrically connected to the first impurity region SD1 through metal silicide. The specific description of the second layer L2 and the third layer L3 may be substantially the same as that of the first layer L1 described above.

Empty spaces in the stacked structure SS may be partially or fully filled with a mold insulating layer ILD. The mold insulating layer ILD may include an insulating material. The mold insulating layer ILD may include, for example, at least one of a silicon oxide film, a silicon nitride film, a silicon oxynitride film, a carbon-containing silicon oxide film, a carbon-containing silicon nitride film, and/or a carbon-containing silicon oxynitride film. As an example, the mold insulating layer ILD may include a silicon oxide film.

A peripheral circuit for operating the sub-cell array SCA may be formed on the substrate SUB. A wiring layer electrically connected to the sub-cell array SCA may be disposed on the stacked structure SS. The peripheral circuit and the sub-cell array SCA may be connected, using the wiring layer.

As an example, the first direction D1, the second direction D2, and the third direction D3 may be perpendicular to each other, but are not limited thereto. Further, the first direction D1 and the second direction D2 may be parallel to the upper side of the substrate SUB, and the third direction D3 may be perpendicular to the upper side of the substrate SUB.

Figure 4:
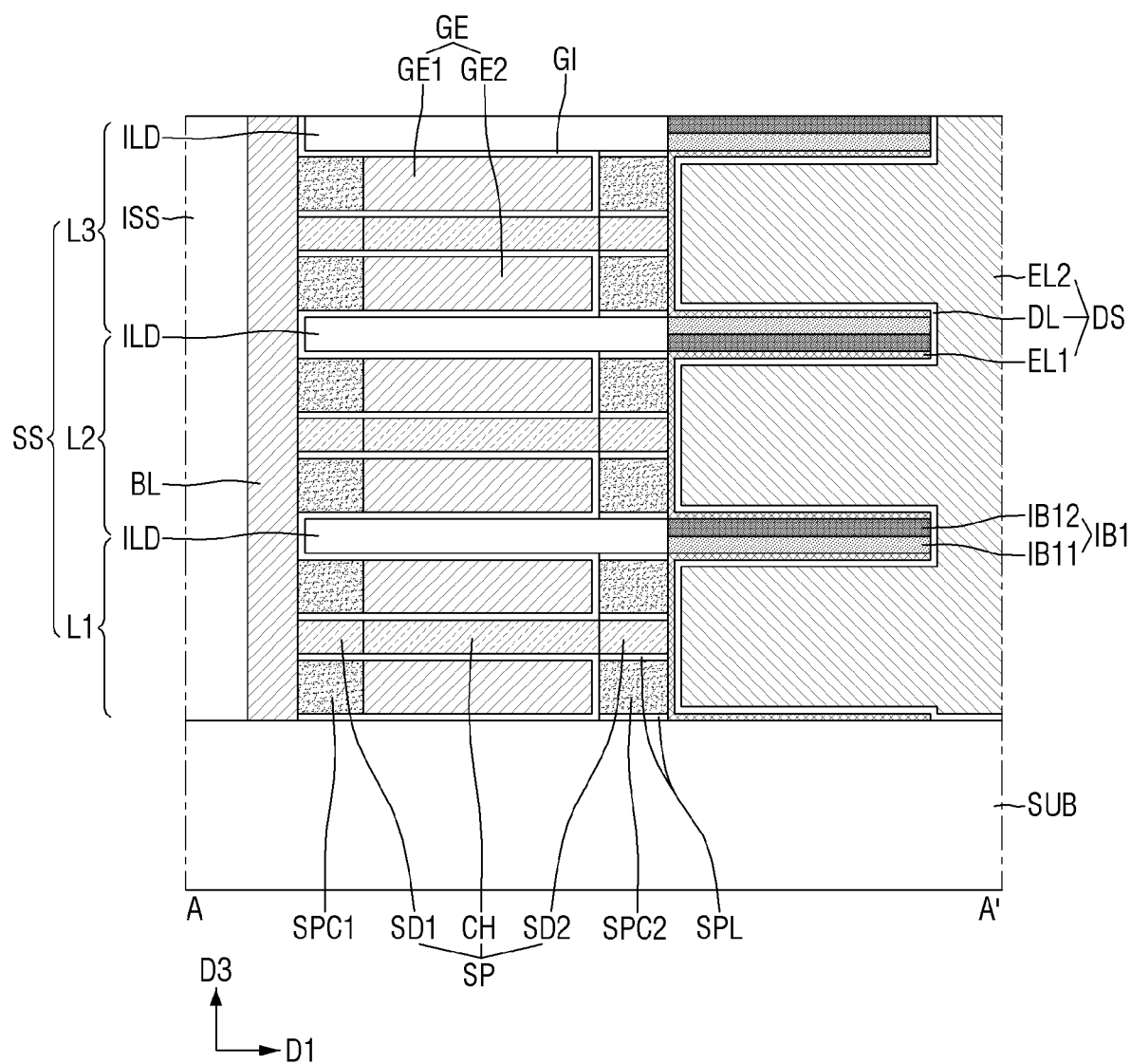
FIG. 4 is a cross-sectional view taken along A-A' of FIG. 2.
Figure 5:
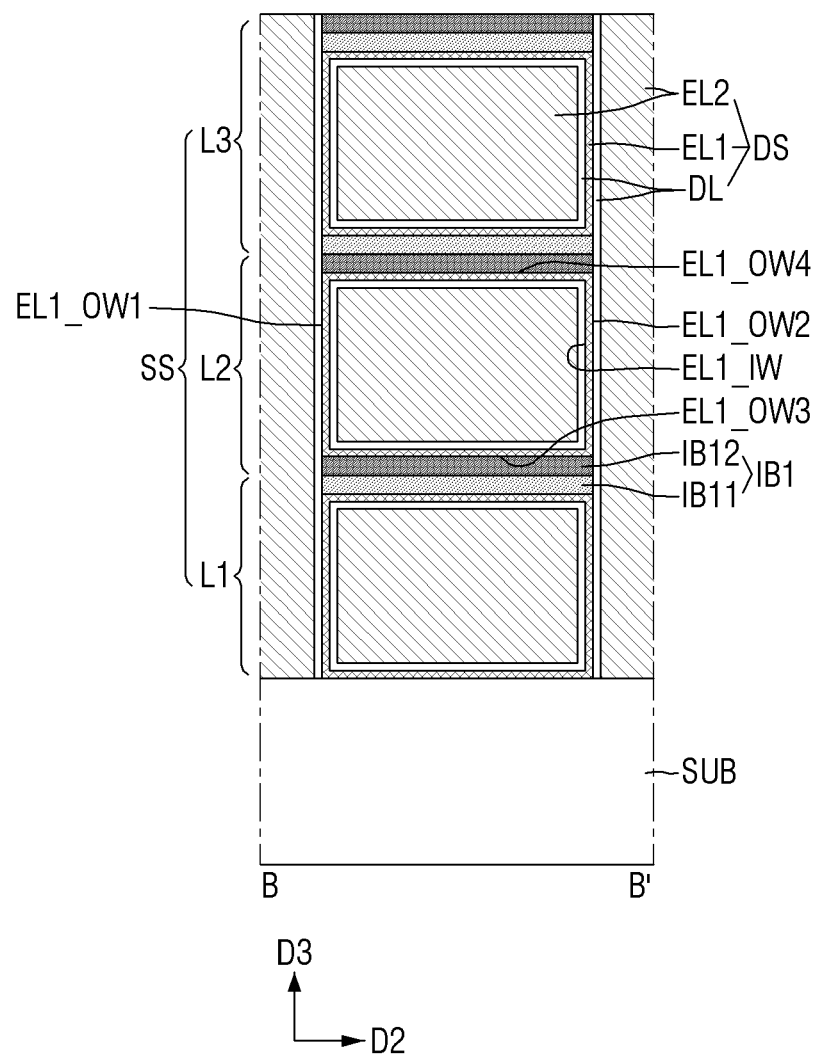
FIG. 5 is a cross-sectional view taken along B-B' of FIG. 2.

FIG. 4 is a cross-sectional view taken along line A-A' of 2. FIG. 5 is a cross-sectional view taken along line B-B' of FIG. 2. For convenience of explanation, points different from those described using FIGS. 1 to 3 will be mainly described.

Referring to FIGS. 4 and 5, the semiconductor memory device according to some embodiments may include a substrate SUB, a bit line BL, a gate electrode GE, a semiconductor pattern SP, and an information storage element DS.

A plurality of mold insulating layers ILD may be disposed on the substrate SUB. The respective mold insulating layers ILD may be disposed apart from each other in the third direction D3. Although three mold insulating layers ILD are shown, this is merely for convenience of explanation, and the embodiment is not limited thereto.

For example, the mold insulating layer ILD located at the lowermost part is spaced apart from the substrate SUB, and the semiconductor pattern SP and the gate electrode GE may be disposed between the mold insulating layer ILD and the substrate SUB. As another example, the mold insulating layer ILD located at the lowermost part may be in contact with the substrate SUB. Further, an etching stop film disposed along the upper side of the substrate SUB may be further disposed between the gate electrode GE disposed at the lowermost part and the substrate SUB.

The plurality of semiconductor patterns SP may be disposed between the mold insulating layers ILD adjacent to each other in the third direction D3. The respective semiconductor patterns SP may be disposed apart from each other in the third direction D3. That is, a plurality of semiconductor patterns SP may be disposed on the substrate SUB to be spaced apart from each other in the third direction D3. The mold insulating layer ILD may be disposed between the semiconductor patterns SP adjacent to each other in the third direction D3. Although the mold insulating layer ILD may not be disposed between the semiconductor pattern SP located at the lowermost part and the substrate SUB, this is merely for convenience of explanation, and the embodiment is not limited thereto. Each semiconductor pattern SP may extend in the second direction D2.

Each gate electrode GE may include a first gate electrode GE1 and a second gate electrode GE2 spaced apart in the third direction D3. The first gate electrode GE1 and the second gate electrode GE2 may each extend in the first direction D1. Each semiconductor pattern SP may be disposed between the first gate electrode GE1 and the second gate electrode GE2.

The gate insulating film GI may be disposed between the first gate electrode GE1 and the semiconductor pattern SP, and between the first gate electrode GE1 and the mold insulating layer ILD. The gate insulating film GI may be disposed between the second gate electrode GE2 and the semiconductor pattern SP, and between the second gate electrode GE2 and the mold insulating layer ILD.

The bit line BL may extend on the substrate SUB in the third direction D3. The bit line BL may be connected to a plurality of semiconductor patterns SP spaced apart in the third direction D3. The bit line BL may be electrically connected to the semiconductor pattern SP.

A separation insulating structure ISS may be disposed on the substrate SUB. The separation insulating structure ISS may spatially separate the bit lines BL adjacent to each other in the first direction D1. The separation insulating structure ISS may include, for example, an insulating material.

A first spacer pattern SPC1 may be disposed between the semiconductor pattern SP and the mold insulating layer ILD. The first spacer pattern SPC1 may be disposed on each of the upper side and the lower side in the third direction D3 of the semiconductor pattern SP.

The first spacer pattern SPC1 may spatially separate the gate electrode GE and the bit line BL. The gate insulating film GI may be interposed between the first spacer pattern SPC1 and the semiconductor pattern SP, and between the first spacer pattern SPC1 and the mold insulating layer ILD. In some embodiments, unlike the shown example, the gate insulating film GI may not be interposed between the first spacer pattern SPC1 and the semiconductor pattern SP, and between the first spacer pattern SPC1 and the mold insulating layer ILD.

A second spacer pattern SPC2 may be disposed between the semiconductor pattern SP and the mold insulating layer ILD. The second spacer pattern SPC2 may be disposed on each of the upper side and the lower side in the third direction D3 of the semiconductor pattern SP.

The second spacer pattern SPC2 may be disposed between the gate electrode GE and the information storage element DS. The gate insulating film GI may be interposed between the second spacer pattern SPC2 and the gate electrode GE. The gate insulating film GI may not be interposed between the second spacer pattern SPC2 and the semiconductor pattern SP, and between the second spacer pattern SPC2 and the mold insulating layer ILD.

A spacer liner SPL may be interposed between the second spacer pattern SPC2 and the semiconductor pattern SP, and between the second spacer pattern SPC2 and the mold insulating layer ILD. The second spacer pattern SPC2 and the spacer liner SPL may be filled between the mold insulating layer ILD and the semiconductor pattern SP. The second spacer pattern SPC2 may be filled between the spacer liners SPL.

The first spacer pattern SPC1 and the second spacer pattern SPC2 may each include, for example, at least one of a silicon oxide film, a silicon nitride film, a silicon oxynitride film, a carbon-containing silicon oxide film, a carbon-containing silicon nitride film, and/or a carbon-containing silicon oxynitride film. The spacer liner SPL may include silicon nitride.

Each information storage element DS may be disposed on the side walls (for example, the side walls in the first direction D1) of the gate electrode GE and the semiconductor pattern SP adjacent to each other in the third direction D3. Each information storage element DS may be connected to each semiconductor pattern SP. Each information storage element DS may include a capacitor dielectric film DL, a first electrode EL1, and a second electrode EL2.

The information storage elements DS of the stacked structure SS may share one capacitor dielectric film DL and one second electrode EL2. A plurality of first electrodes EL1 are provided in the stacked structure SS, and one capacitor dielectric film DL may cover the surfaces of the first electrodes EL1. The second electrode EL2 may be provided on one capacitor dielectric film DL. Each information storage element DS may be defined by the respective first electrodes EL1.

The first electrode EL1 may have a cylinder shape with an empty interior in which a first portion facing the semiconductor pattern SP is closed, and a second portion opposite to the first portion is opened. In other words, the first electrode EL1 may have a U-shape rotated by 90 degrees in the first direction D1. The first electrode EL1 may be electrically connected to the semiconductor pattern SP. The first electrode EL1 may be in direct contact with, for example, the semiconductor pattern SP.

The first electrode EL1 may include an inner wall EL1_IW and outer walls EL1_OW1 to EL1_OW4. The inner wall EL1_IW may include both side walls opposite to each other in the second direction D2, and both side walls opposite to each other in the third direction D3. The outer walls EL1_OW1 to EL1_OW4 may include both side walls EL1_OW1 and EL1_OW2 opposite to each other in the second direction D2, and both side walls EL1_OW3 and EL1_OW4 opposite to each other in the third direction D3.

In some embodiments, the first electrodes EL1 may be separated by an insulating buffer film D31. The insulating buffer film IB1 may be disposed on the side wall of the semiconductor pattern SP (for example, the side wall in the first direction D1). The insulating buffer film IB1 may be disposed between the first electrodes EL1 adjacent to each other in the third direction D3. The insulating buffer film IB1 may be filled between the first electrodes EL1 adjacent to each other in the third direction D3. That is, the insulating buffer film D31 may be disposed on both side walls EL1_OW3 and EL1_OW4 opposite to each other in the third direction D3 of the first electrode EL1. For example, when the mold insulating layer ILD located at the lowermost part is in contact with the substrate SUB, the insulating buffer film IB1 is disposed on the side wall of the mold insulating layer ILD located at the lowermost part, and may be in contact with the substrate SUB.

In some embodiments, the insulating buffer film IB1 may include an insulating material. The insulating buffer film IB1 may include a material different from that of the capacitor dielectric film DL. A dielectric constant of the insulating buffer film IB1 may be smaller than the dielectric constant of the capacitor dielectric film DL. The insulating material may include, for example, at least one of a silicon oxide film, a silicon nitride film, and/or a silicon oxynitride film.

In some embodiments, the insulating buffer film IB1 may be a single film or a multi-film. For example, the insulating buffer film D31 may include a first insulating buffer film IB11 and a second insulating buffer film IB12. The insulating buffer films IB1 adjacent to each other in the third direction D3 may be symmetric on the basis of a plane including the first direction D1 and the second direction D2, between the insulating buffer films IB1 adjacent to each other. For example, the first insulating buffer film IB11 and the second insulating buffer film IB12 are sequentially disposed on the first electrode EL1 of the first layer L1, and the second insulating buffer film IB12 and the first insulating buffer film IB11 may be sequentially disposed on the first electrode EL1 of the second layer L2.

For example, the first insulating buffer film IB11 and the second insulating buffer film IB12 may include different insulating materials from each other. Further, for example, the first insulating buffer film IB11 and the second insulating buffer film IB12 may include the same material.

The capacitor dielectric film DL may be disposed on the first electrode EL1 and the insulating buffer film D31. The capacitor dielectric film DL may extend along the profiles of the plurality of first electrodes EL1 and the insulating buffer film IB1.

In some embodiments, the capacitor dielectric film DL may extend along the inner wall EL1_IW of the first electrode EL1 The capacitor dielectric film DL may extend along a part of the outer walls EL1_OW1 to EL1_OW4 of the first electrode EL1. The capacitor dielectric film DL is not disposed between the first electrodes EL1 separated in the third direction D3. The capacitor dielectric film DL extends along the side wall of the first portion of the first electrode EL1 facing the semiconductor pattern SP and both side walls EL1_OW1 and EL1_OW2 opposite to each other in the second direction D2, but does not extend along both side walls EL1_OW3 and EL1_OW4 opposite to each other in the third direction D3.

The second electrode EL2 may be disposed on the capacitor dielectric film DL. The second electrode EL2 may fill the cylindrical interior of the first electrode EL1.

That is, the information storage element DS may have a six-sided OCS form. The capacitor dielectric film DL may cover the four inner walls EL1_IW and the two outer walls EL1_OW1 and EL1_OW2 of the first electrode EL1, and the second electrode EL2 may cover the four inner walls EL1_IW and the two outer walls EL1_OW1 and EL1_OW2 of the first electrode EL1 with the capacitor dielectric film DL interposed therebetween.

The first electrode EL1 and the second electrode EL2 may each include, for example, but are not limited to, a doped semiconductor material, a conductive metal nitride (e.g., titanium nitride, tantalum nitride, niobium nitride or tungsten nitride, etc.), a metal (e.g., ruthenium, iridium, titanium, niobium, tungsten, cobalt, molybdenum or tantalum, etc.), and/or a conductive metal oxide (e.g., iridium oxide or niobium oxide, etc.), and/or the like. As an example, the electrode EL1 may include a conductive metal nitride, a metal and a conductive metal oxide. The conductive metal nitride, the metal and the conductive metal oxide may be included in the metallic conductive film.

The capacitor dielectric film DL may include, for example, a high dielectric constant material (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof). In the semiconductor memory device according to some embodiments, the capacitor dielectric film DL may include a stacked film structure in which zirconium oxide, aluminum oxide, and zirconium oxide are sequentially stacked. In the semiconductor memory device according to some embodiments, the capacitor dielectric film DL may include hafnium (Hf).

When the capacitor dielectric film DL extends along both the inner wall EL1_IW and the outer walls EL1_OW1 to EL1_OW4 of the first electrode EL1, and the information storage element DS has an eight-sided OCS form, the second electrode EL2 is disposed on the outer walls EL1_OW3 and EL1_OW4 in the third direction D3 of the first electrode EL1. The height of the information storage element DS increases due to the second electrode EL2 disposed on the outer walls EL1_OW3 and EL1_OW4 in the third direction D3 of the first electrode EL1. Further, since the space between the outer walls EL1_OW3 and EL1_OW4 in the third direction D3 of the first electrode EL1 is narrow, the difficulty of the process of forming the second electrode EL2 increases.

On the other hand, in the semiconductor memory device according to some embodiments, the second electrode EL2 is not formed on the outer walls EL1_OW3 and EL1_OW4 in the third direction D3 of the first electrode EL1. Therefore, the height of the information storage element DS may be reduced, and the difficulty of the process decreases. Further, since the insulating buffer film IB1 having a dielectric constant lower than that of the capacitor dielectric film DL is formed between the first electrodes EL1 adjacent to each other in the third direction D3, the reliability of the semiconductor memory device can be improved.

Figure 6:
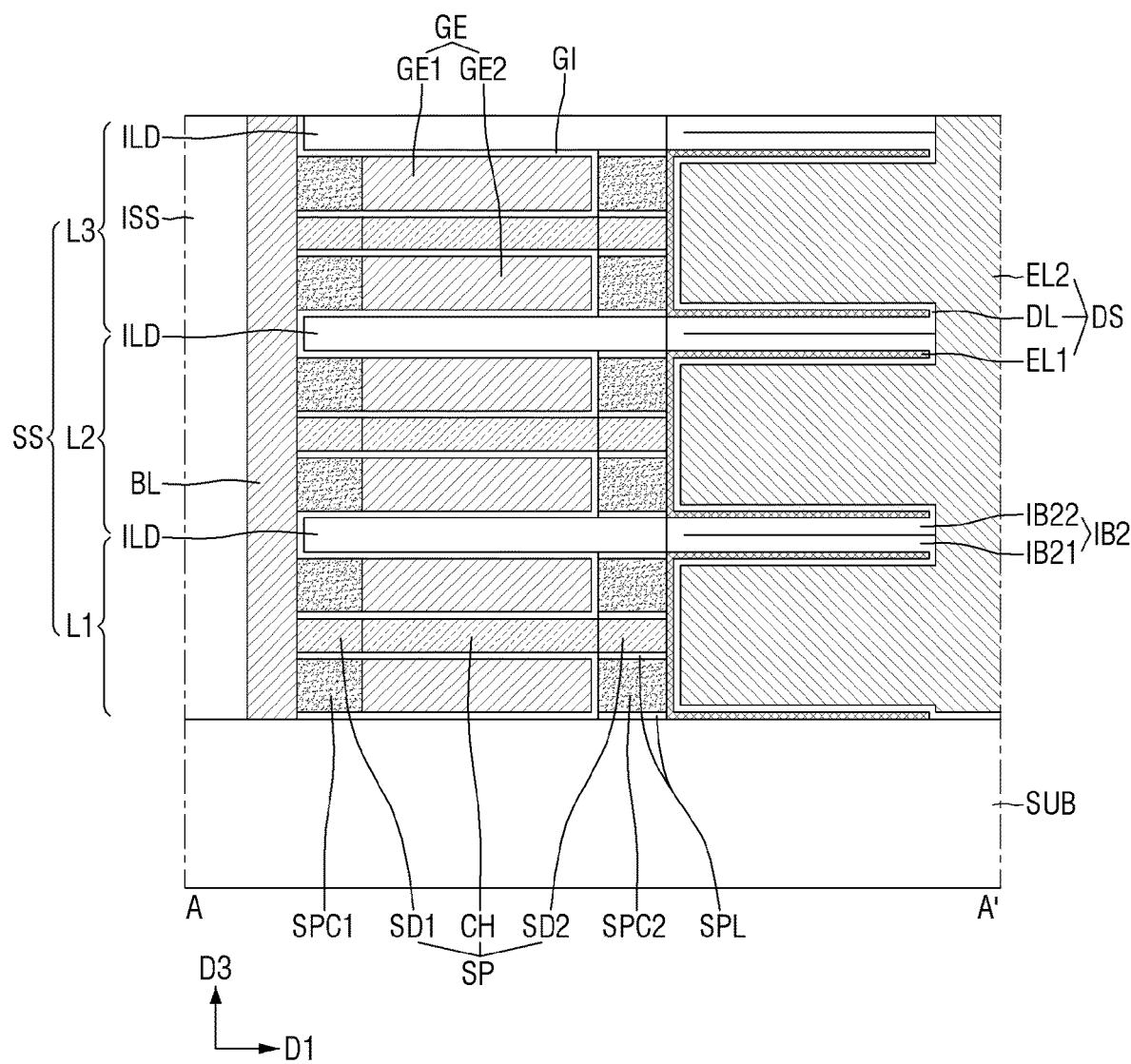
FIGS. 6 to 10 are cross-sectional views for explaining a semiconductor memory device according to some embodiments.
Figure 7:
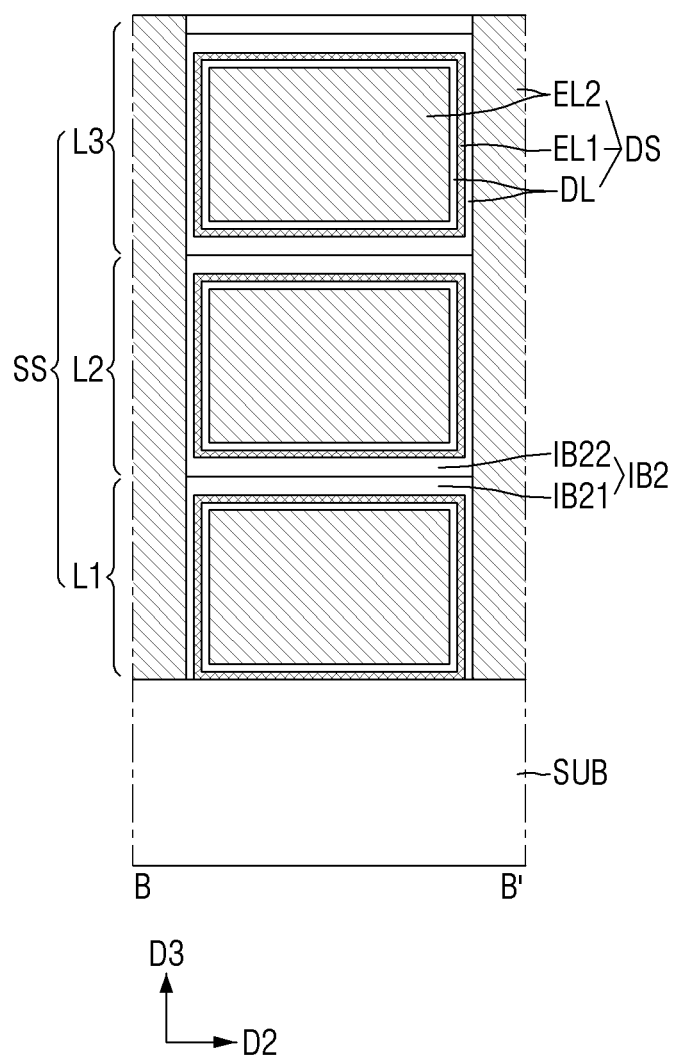
Figure 8:
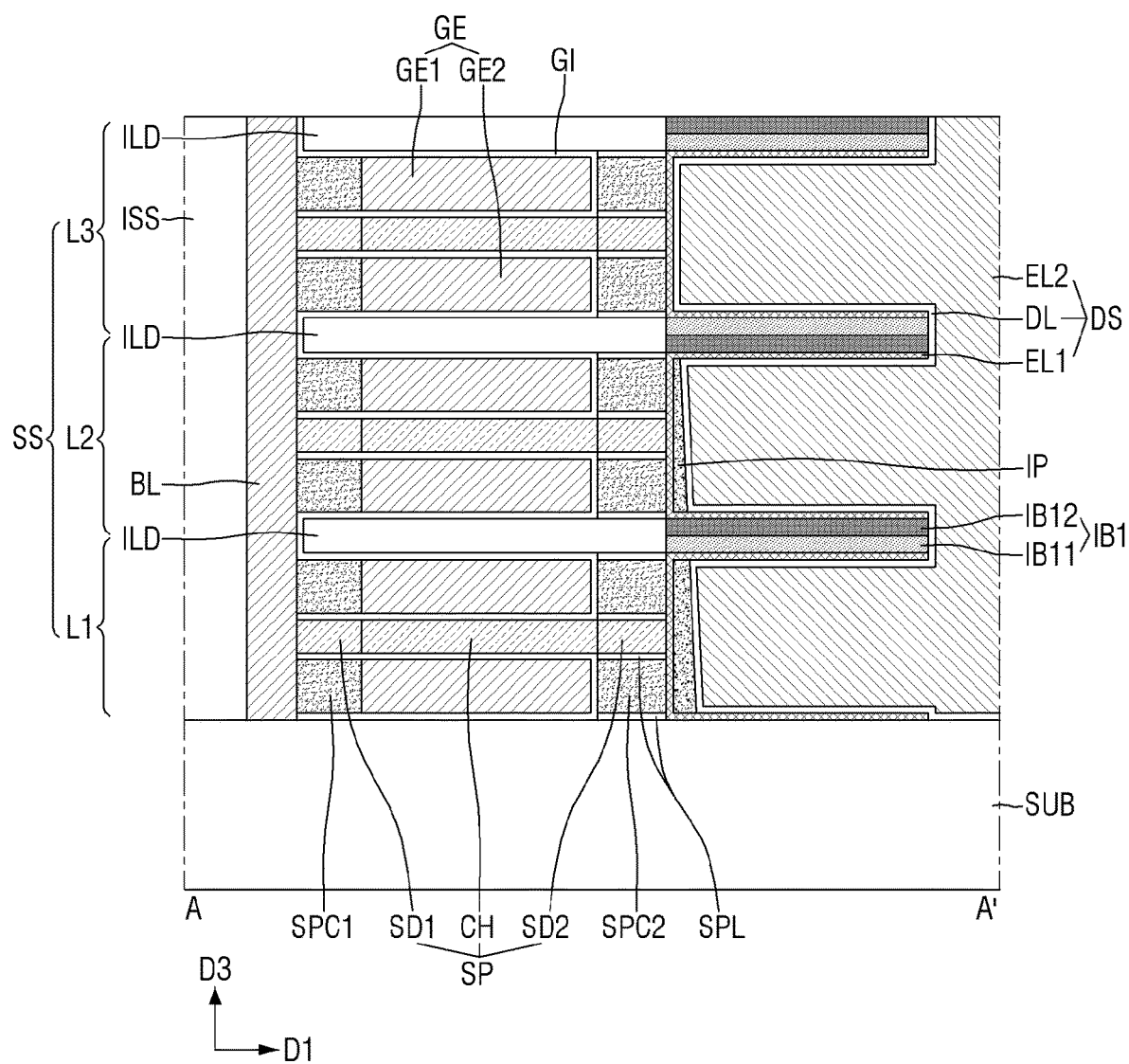

FIGS. 6 to 10 are cross-sectional views for explaining a semiconductor memory device according to some embodiments. FIGS. 6 and 8 to 10 are cross-sectional views taken along A-A' of FIG. 2, and FIG. 8 is a cross-sectional view taken along B-B' of FIG. 2. For convenience of explanation, points different from those described using FIGS. 1 to 5 will be mainly described.

Referring to FIGS. 6 and 7, in the semiconductor memory device according to some embodiments, the first electrodes EL1 may be separated by an insulating buffer film IB2.

The insulating buffer film IB2 may include the same material as the capacitor dielectric film DL. The insulating buffer film IB2 may be formed by the process of forming the capacitor dielectric film DL.

The insulating buffer film IB2 may be a single film or a multi-film. For example, the insulating buffer film IB2 may include a first insulating buffer film D321 and a second insulating buffer film D322 including the same material as the capacitor dielectric film DL. A boundary between the first insulating buffer film IB21 and the second insulating buffer film IB22 may be, for example, visible in a part, but may not be visible in another part. The boundary between the first insulating buffer film D321 and the second insulating buffer film IB22 shown in FIGS. 6 and 7 is merely an example, and the present disclosure is not limited thereto.

Referring to FIG. 8, the semiconductor memory device according to some embodiments may further include a separation pattern IP. The separation pattern IP may be disposed on at least one first electrode EL1 On the upper side of the substrate SUB, a width of the separation pattern IP in the first direction D1 may decrease as it goes away from the upper side of the substrate SUB. Further, the separation pattern IP may not be disposed on the first electrode EL1 of the third layer L3 disposed at the uppermost part.

The separation pattern IP may be disposed between the insulating buffer films IB1 adjacent to each other in the third direction D3. The separation pattern IP may be disposed on the side wall of the first portion of the first electrode EL1 that is closed toward the semiconductor pattern SP. The separation pattern IP may be disposed on the side walls opposite to each other in the third direction D3 of the first electrode EL1 of the single layer L1 to L3. For reference, FIG. 8 shows the insulating buffer film D31 of FIG. 4, but is not limited thereto. Of course, the insulating buffer film IB1 of FIG. 8 may have the insulating buffer film IB2 of FIG. 6.

The separation pattern IP may include, for example, silicon oxide.

The capacitor dielectric film DL may extend along the separation pattern IP, the first electrode EL1, and the insulation buffer film IB2. A capacitor dielectric film DL may be interposed between the separation pattern IP and the second electrode EL2.

Figure 9:
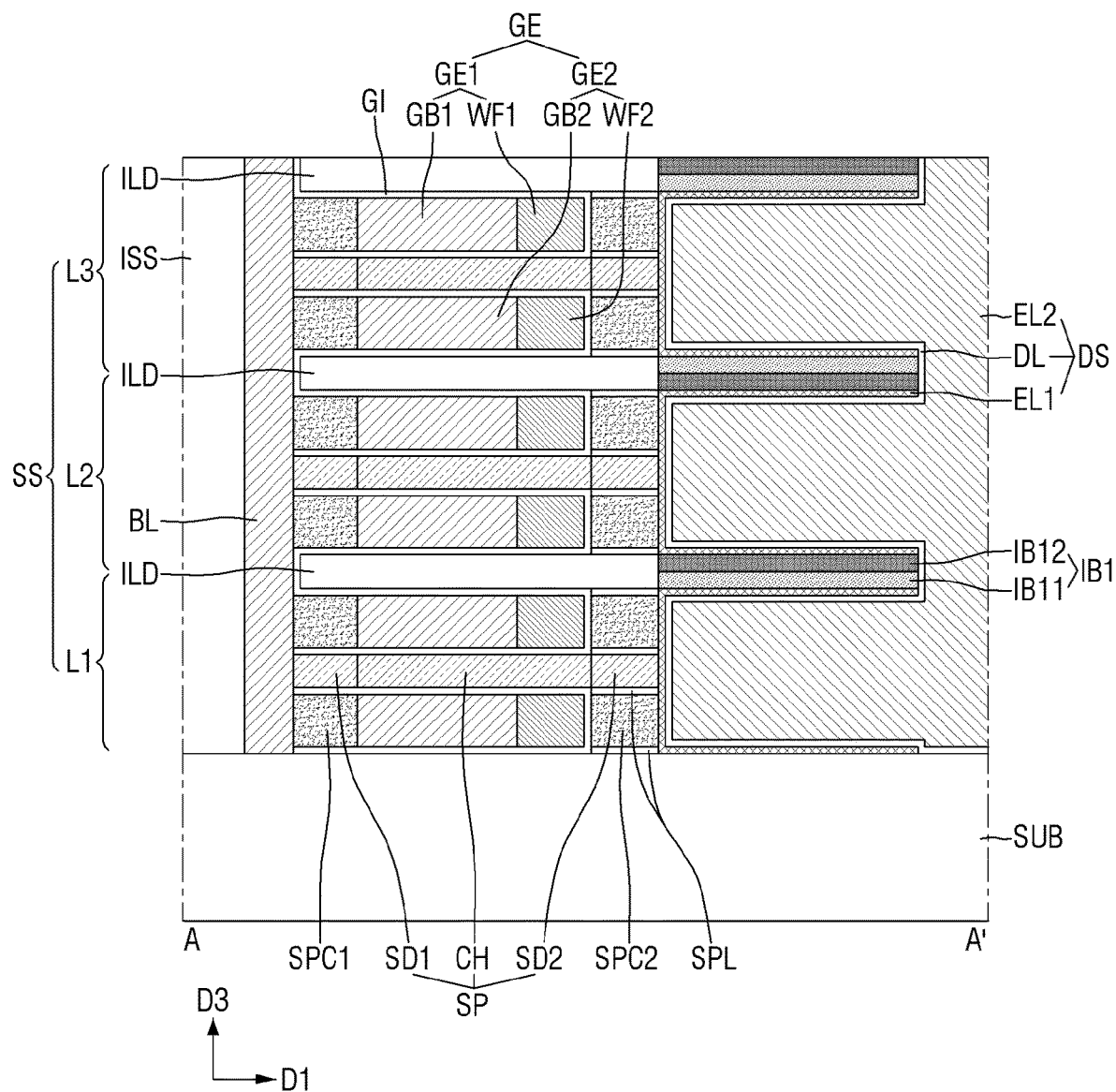
Figure 10:
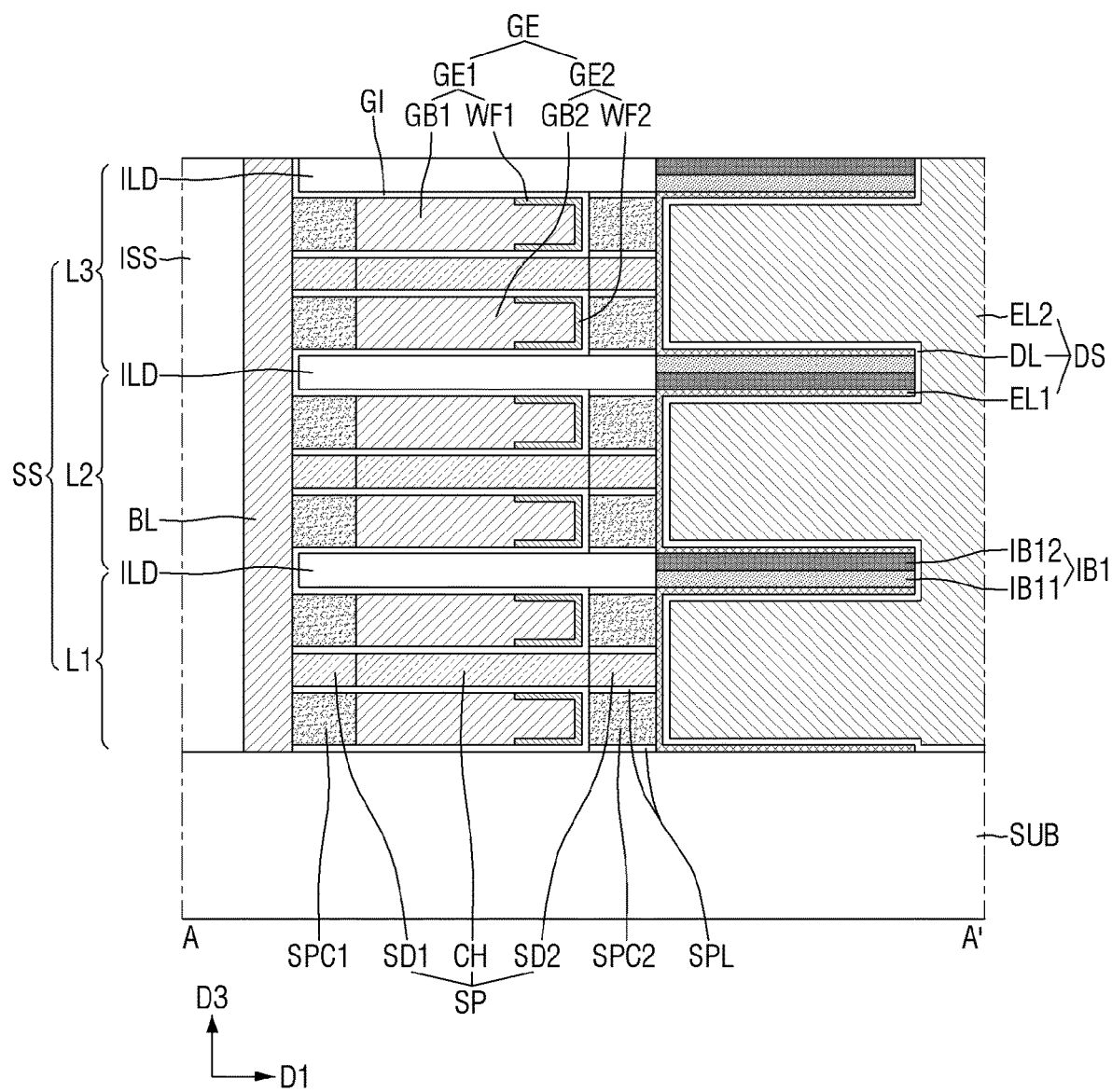

Referring to FIGS. 9 and 10, in the semiconductor memory device according to some embodiments, the first gate electrode GE1 may include a first gate body layer GB1 and a first work function adjusting layer WF1. The second gate electrode GE2 may include a second gate body layer GB2 and a second work function adjusting layer WF2.

Referring to FIG. 9, the first and second gate body layers GB1 and GB2 may be disposed in the portion near the bit line BL, and the first and second work function adjusting layers WF1 and WF2 may be disposed in a portion separated from the bit line BL with the first spacer pattern SPC1 therebetween.

Referring to FIG. 10, the first and second work function adjusting layers WF1 and WF2 may wrap one end portions of the first and second gate body layers GB1 and GB2.

For example, the first and second work function adjusting layers WF1 and WF2 may be made up of impurity-doped polysilicon. For example, the first and second gate body layers GB1 and GB2 may include Ru, RuO, Pt, PtO, Ir, IrO, SRO(SrRuO), BSRO((Ba,Sr)RuO), CRO(CaRuO), BaRuO, La(Sr,Co)O, Ti, TiN, W, WN, Ta, TaN, TiAlN, TiSiN, TaAlN, TaSiN or a combination thereof.

Figure 11:
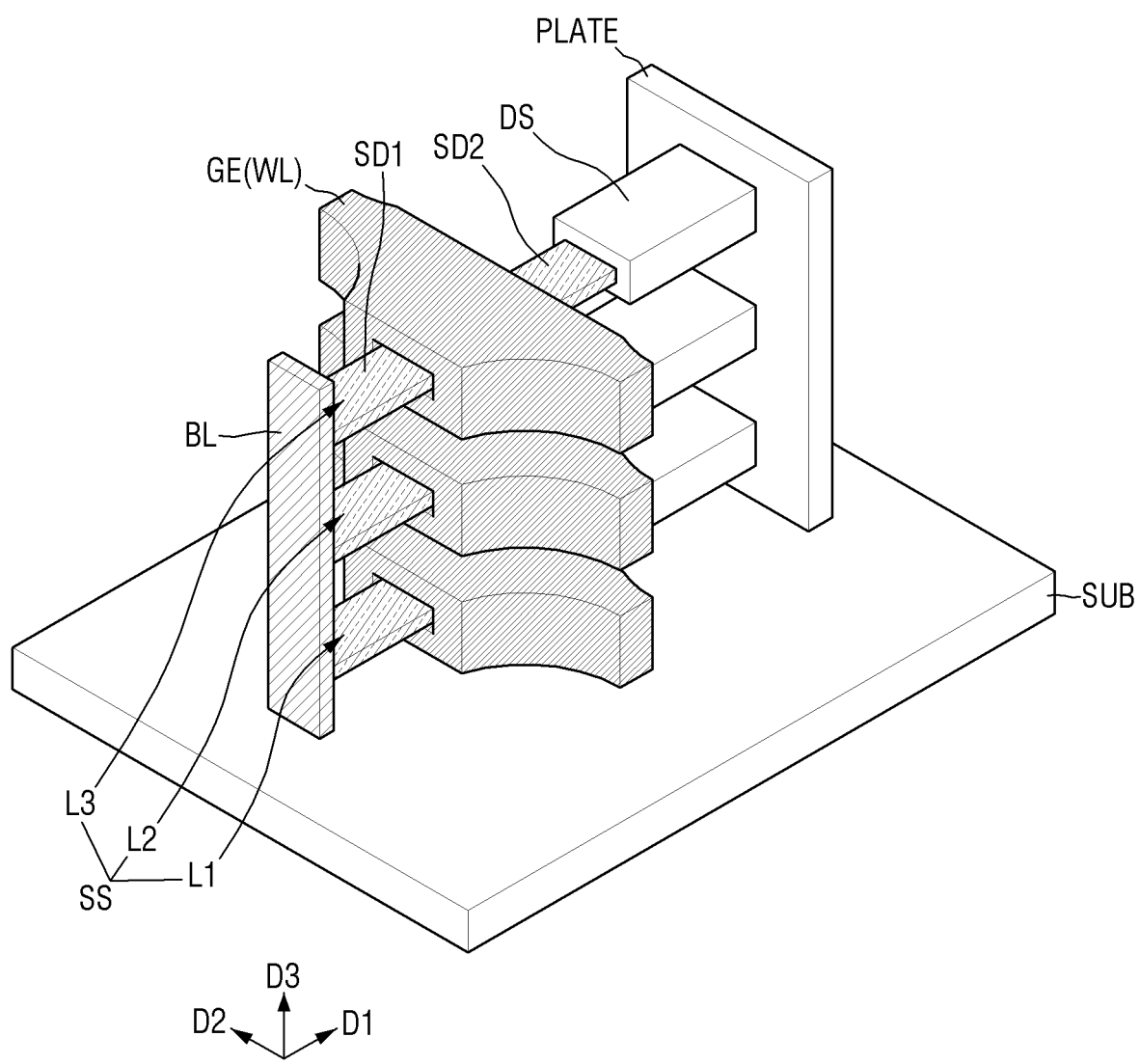
FIGS. 11 to 14 are perspective views of a semiconductor memory device according to some embodiments.
Figure 12:
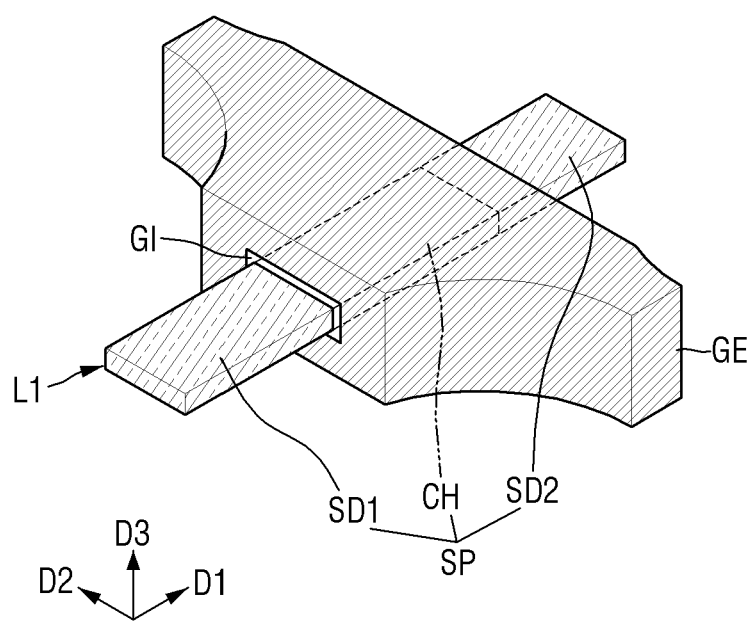

FIGS. 11 to 14 are perspective views of the semiconductor memory device according to some embodiments. FIG. 12 is a diagram showing only the first layer L1 and the gate electrode GE in FIG. 11. For convenience of explanation, points different from those described referring to FIGS. 1 to 3 will be mainly described.

Referring to FIGS. 11 and 12, in a semiconductor memory device according to some embodiments, the gate electrode GE may surround the channel region CH of the semiconductor pattern SP. The gate electrode GE may be provided on the upper side and the lower side in the third direction D3 of the channel region CH, and on both side walls in the second direction D2. The semiconductor pattern SP may penetrate the gate electrode GE. The memory cell transistor (TR of FIG. 1) may be a gate all-around transistor in which the gate electrode GE surrounds the channel region CH.

In other words, the gate electrode GE may include the first gate electrode GE1 and the second gate electrode GE2 of FIGS. 2 and 3, and connecting gate electrodes that connects the first gate electrode GE1 and the second gate electrode GE2. The connecting gate electrodes may be disposed between the semiconductor patterns SP spaced apart from each other in the second direction D2 at the same level.

Figure 13:
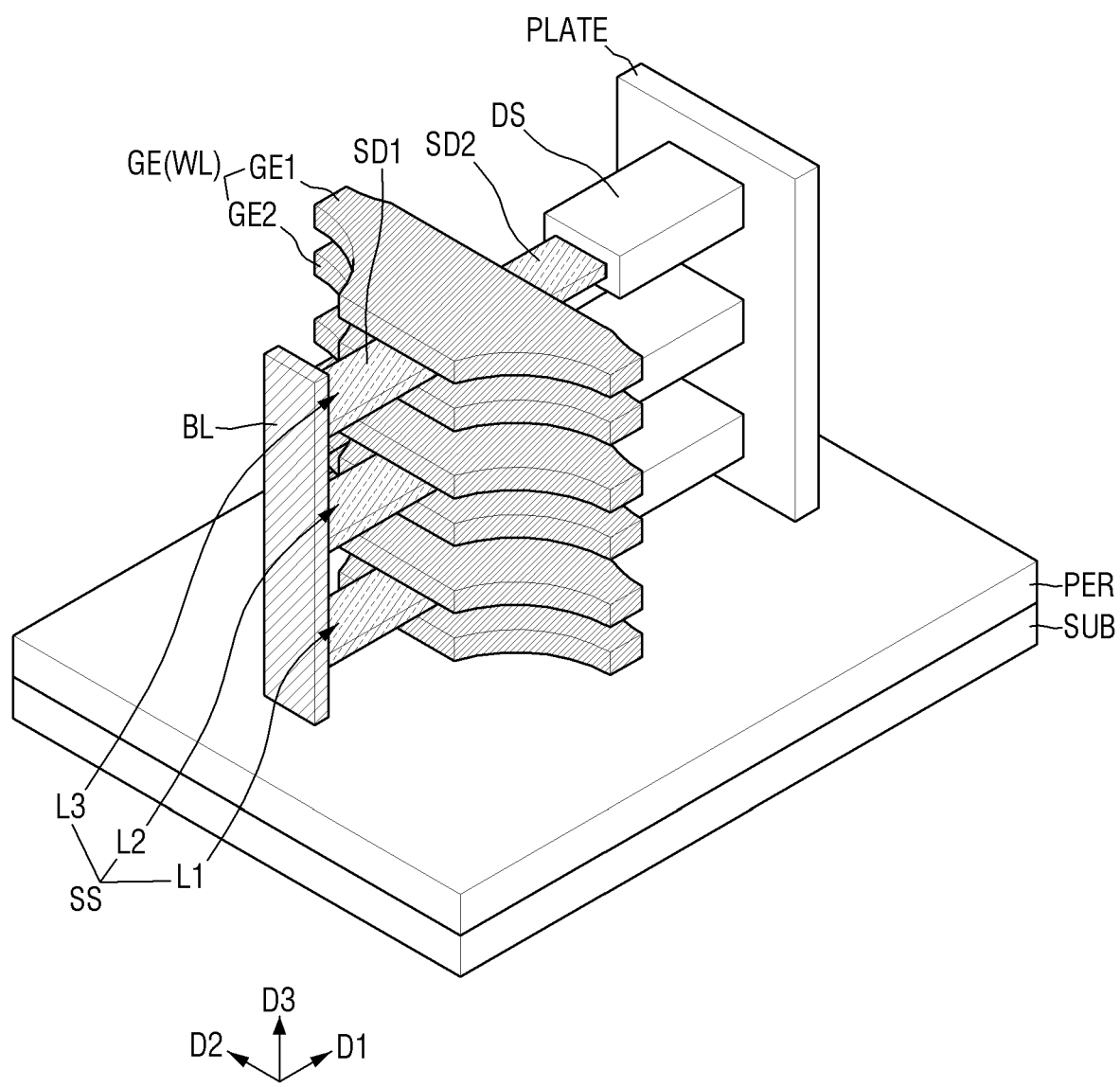
Figure 14:
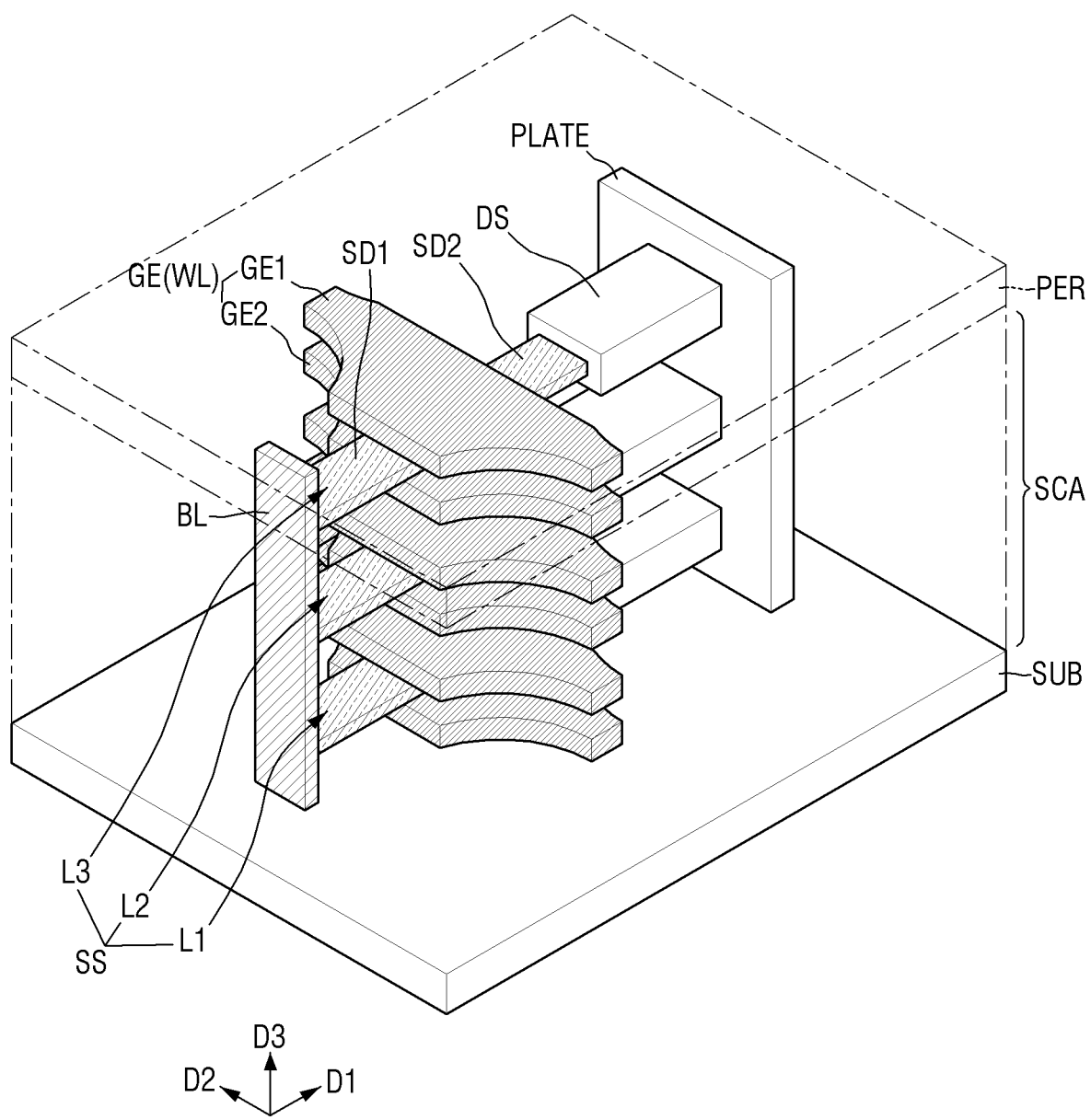

Referring to FIGS. 13 and 14, in the semiconductor memory device according to some embodiments, the peripheral circuit region PER and the sub-cell array SCA may be stacked in the vertical direction (the third direction D3). For reference, FIGS. 13 and 14 are each shown using FIG. 2, but are not limited thereto. It goes without saying that the sub-cell arrays SCA structure of FIGS. 13 and 14 may have the structure described in FIG. 11.

Referring to FIG. 13, the peripheral circuit region PER may be disposed between the substrate SUB and the plurality of sub-cell arrays SCA.

The peripheral circuit region PER may include peripheral circuit transistors formed on the substrate SUB. The peripheral circuit region PER may include a circuit for operating a three-dimensional semiconductor memory device according to some embodiments.

The sub-cell array SCA described referring to FIG. 1 may be disposed on the peripheral circuit region PER. Specifically, the stacked structure SS including the first to third layers L1, L2, and L3 may be disposed on the peripheral circuit region PER.

The wiring layer electrically connected to the sub-cell array SCA may be electrically connected to the peripheral circuit region PER, for example, through a through contact.

Referring to FIG. 14, the sub-cell array SCA may be disposed on the substrate SUB. The peripheral circuit region PER may be disposed on the sub-cell array SCA.

As mentioned above, the peripheral circuit region PER may include a circuit for operating the sub-cell array SCA.

As an example, the peripheral circuit region PER may be electrically connected to the sub-cell array SCA, for example, through the through contact.

As another example, the peripheral circuit region PER may include a peripheral circuit wiring layer that is electrically connected to the circuit for operating the sub-cell array SCA. The wiring layer electrically connected to the sub-cell array SCA may be disposed to face the peripheral circuit wiring layer of the peripheral circuit region PER. The wiring layer electrically connected to the sub-cell array SCA may be electrically connect to the peripheral circuit wiring layer of the peripheral circuit region PER, using the wafer bonding method.

FIGS. 15 to 27 are intermediate step diagrams for explaining a method for manufacturing a semiconductor memory device according to some embodiments. For reference, FIGS. 15, 17, 19, 21, 22, 24 and 26 are cross-sectional views taken along A-A' of FIG. 2, and FIGS. 16, 18, 20, 23, 25 and 27 are cross-sectional views taken along B-B' of FIG. 2.

Figure 15:
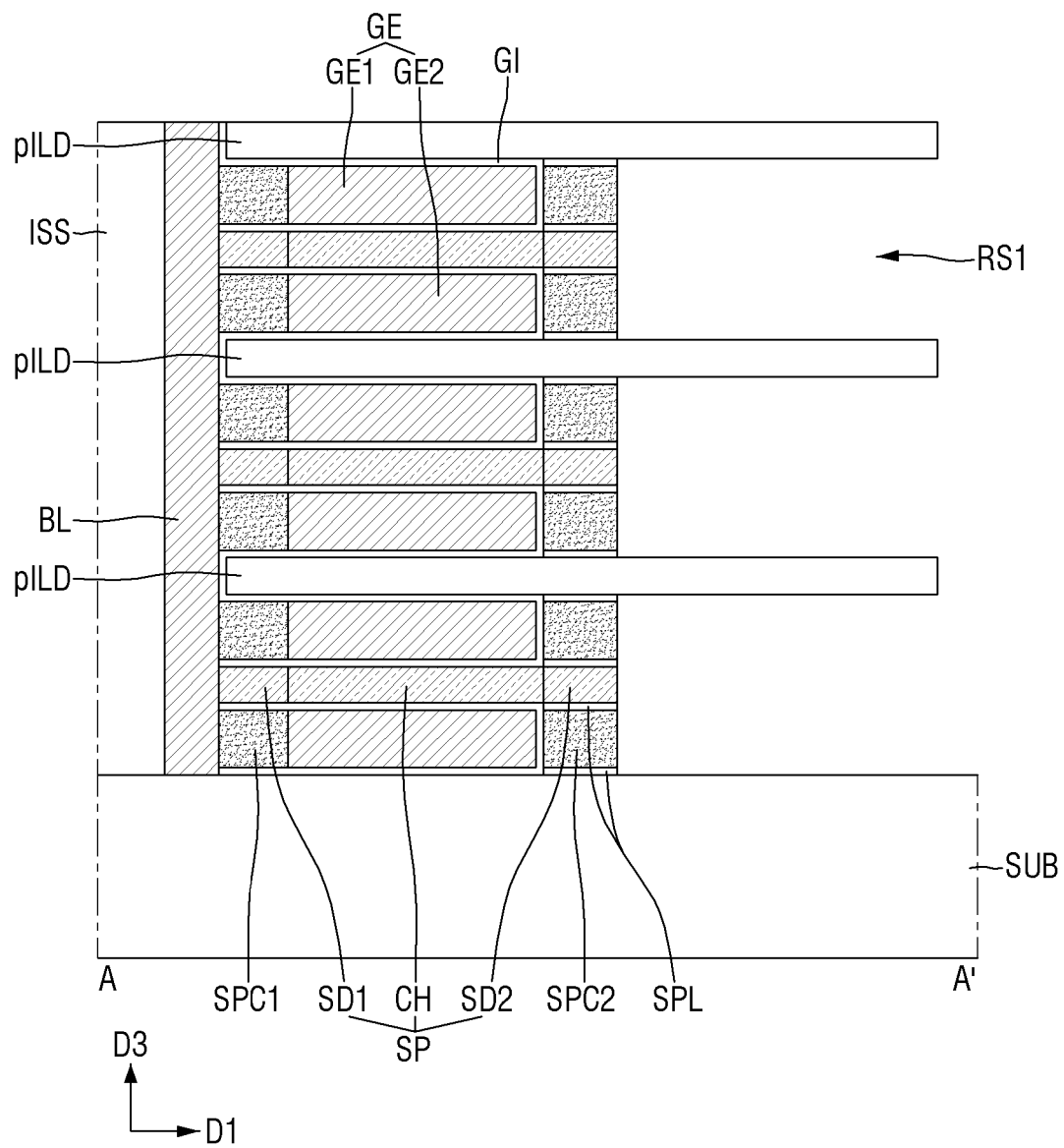
FIGS. 15 to 27 are intermediate step diagrams for explaining a method for manufacturing a semiconductor memory device according to some embodiments.
Figure 16:
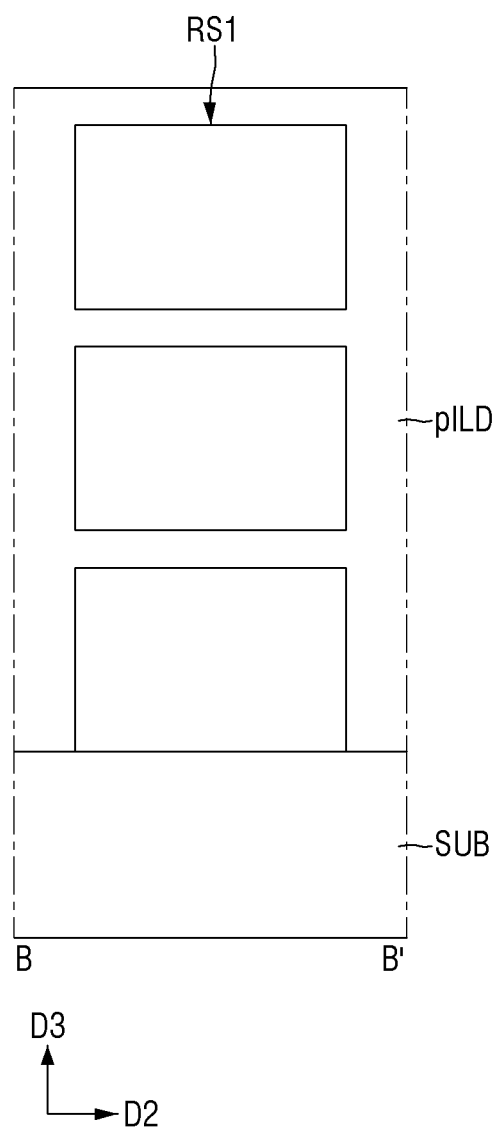

Referring to FIGS. 15 and 16, the separation insulating structure ISS, the bit line BL, the semiconductor pattern SP, the gate electrode GE, the gate insulating film GI, the first and second spacer patterns SPC1 and SPC2, the spacer liner SPL and a pre-mold insulating layer pILD may be provided on the substrate SUB. The pre-mold insulating layer pILD may protrude from the semiconductor pattern SP, the spacer liner SPL, and the second spacer pattern SPC2 in the first direction D1. A first recess RS1 may be defined by the pre-mold insulating layer pILD, the semiconductor pattern SP, the spacer liner SPL, and the second spacer pattern SPC2.

Figure 17:
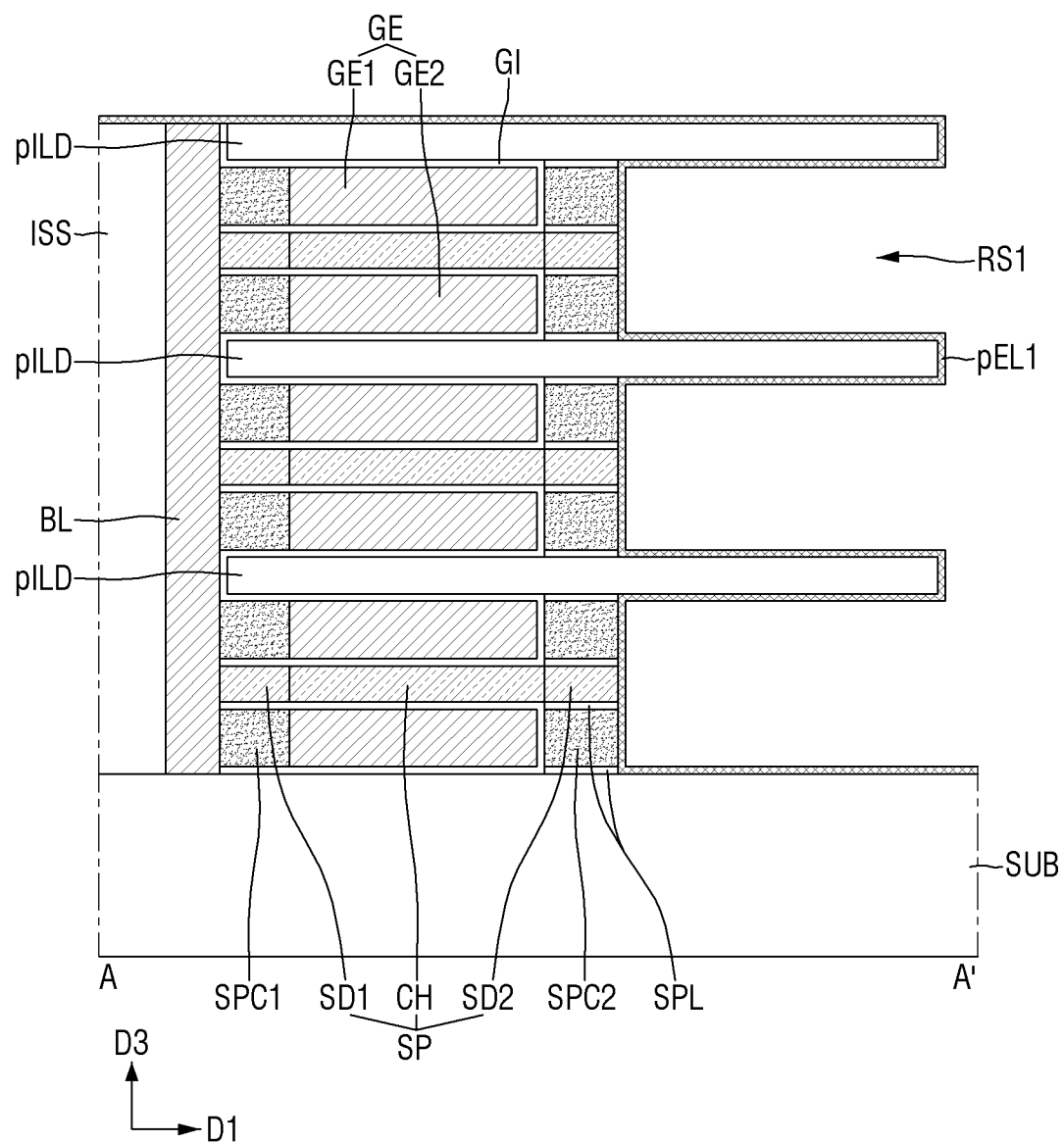
Figure 18:
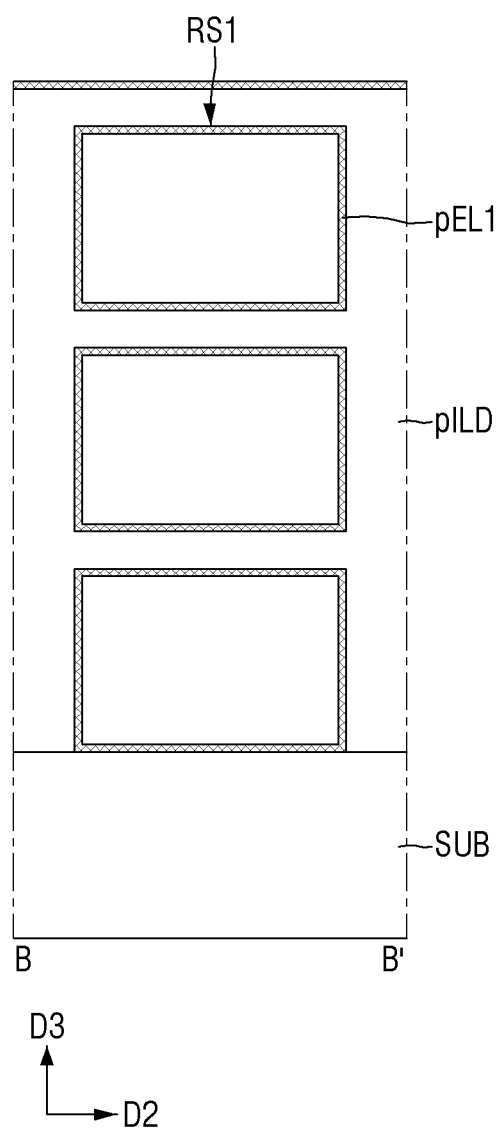

Referring to FIGS. 17 and 18, a pre-first electrode pEIL1 may be formed along the first recess RS1. The pre-first electrode pEL1 may be formed along an upper side of the pre-mold insulating layer pILD disposed at the uppermost part in the third direction D3 and the upper side of the substrate SUB.

Figure 19:
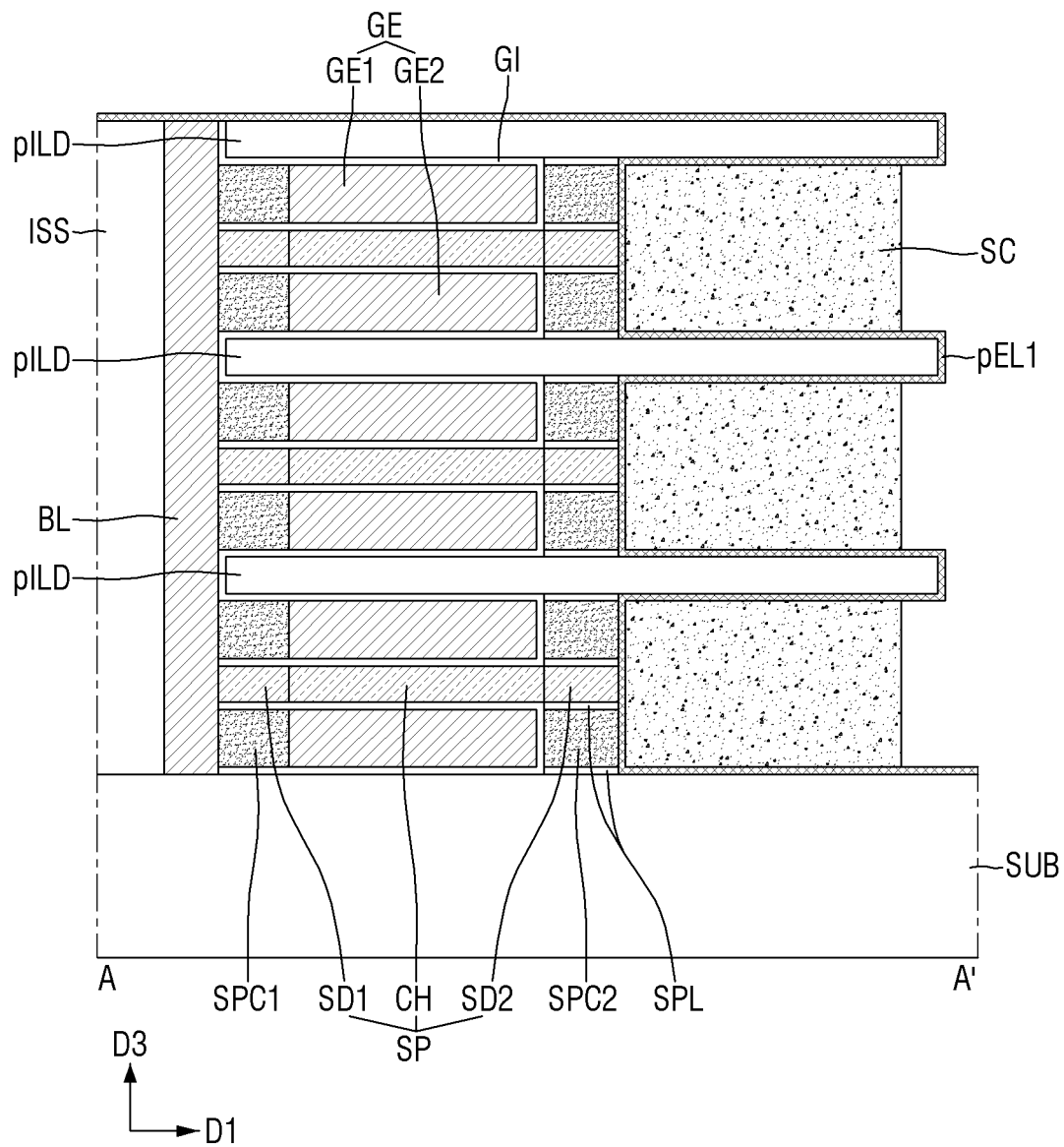
Figure 20:
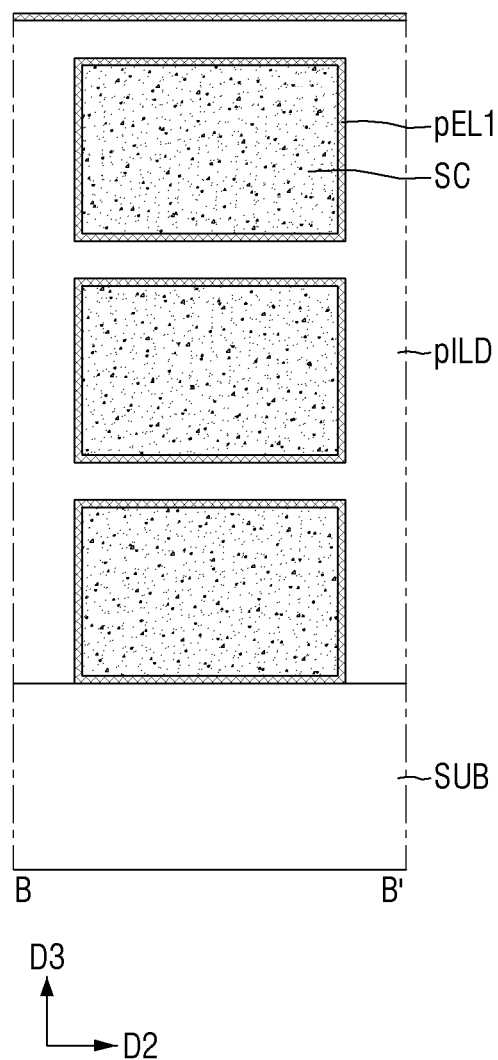

Referring to FIGS. 19 and 20, a sacrificial layer SC that fills at least a part of the first recess RS1 may be formed on the pre-first electrode pEL1. For example, the pre-mold insulating layer pILD may protrude from the sacrificial layer SC in the first direction D1.

The sacrificial layer SC may include, for example, silicon oxide.

Figure 21:
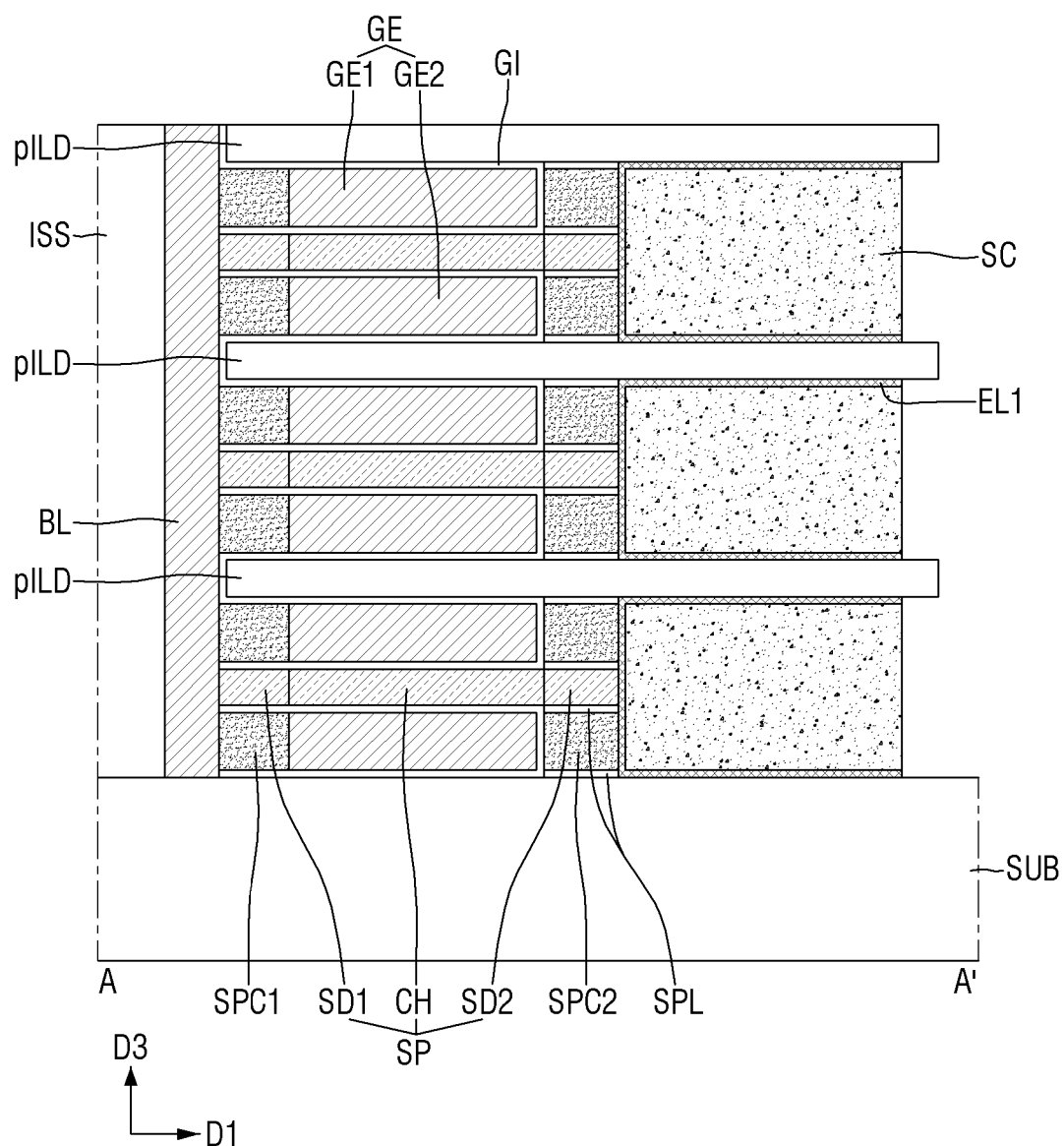

Referring to FIG. 21, the exposed pre-first electrode pEL1 may be removed. The pre-first electrode pEL1 disposed on the pre-mold insulating layer pILD protruding from the sacrificial layer SC in the first direction D1, the pre-first electrode pEL1 exposed by the sacrificial layer SC on the upper side of the substrate SUB, and the pre-first electrode pEL1 on the pre-mold insulating layer pILD disposed on the uppermost part may be removed. As a result, the first electrode EL1 may be formed. One end of the pre-mold insulating layer pILD protruding from the sacrificial layer SC in the first direction D1 may be exposed.

Figure 22:
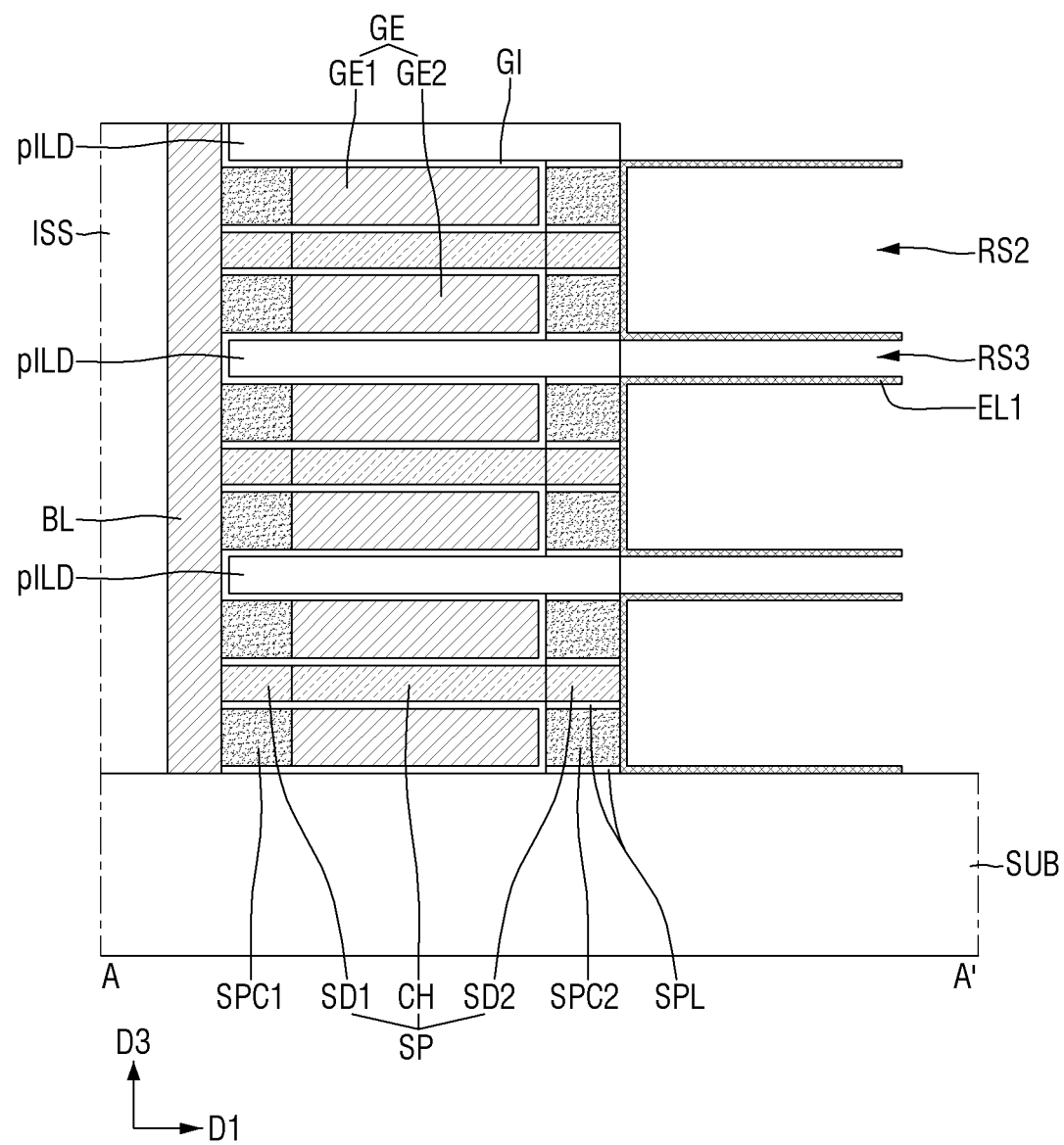
Figure 23:
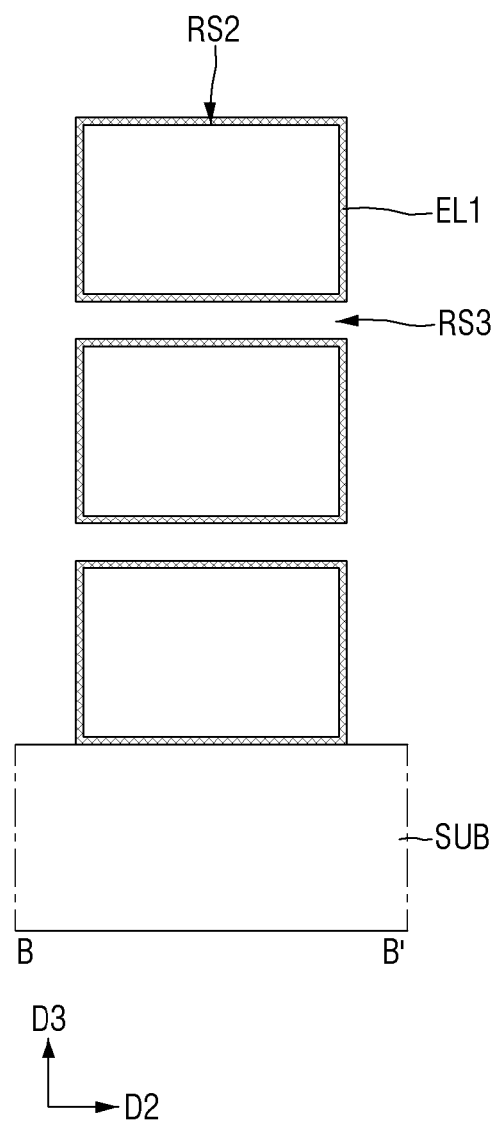

Referring to FIGS. 22 and 23, at least a part of the sacrificial layer SC may be removed to form a second recess RS2. For example, the sacrificial layer SC may be completely removed, and thus, the second recess RS2 may expose the side wall in the first direction D1 of the first electrode ELL As another example, as it comes closer to the substrate SUB, the sacrificial layer SC may not be easily removed. As a result, a part of the sacrificial layer SC may remain. For example, as it comes closer to the substrate SUB, the thickness in the first direction D1 of the sacrificial layer SC may increase. The remaining sacrificial layer SC may be the separation pattern IP of FIG. 8.

A part of the pre-mold insulating layer pILD may be removed to form a third recess RS3. Therefore, the mold insulating layer ILD may be formed. An outer side of the first electrode EL1 may be exposed by the third recess RS3. The side wall of the first electrode EL1 in the first direction D1, the outer walls of the first electrode EL1 in the third direction D3, and the outer walls of the first electrode EL1 in the second direction D2 may be exposed.

Figure 24:
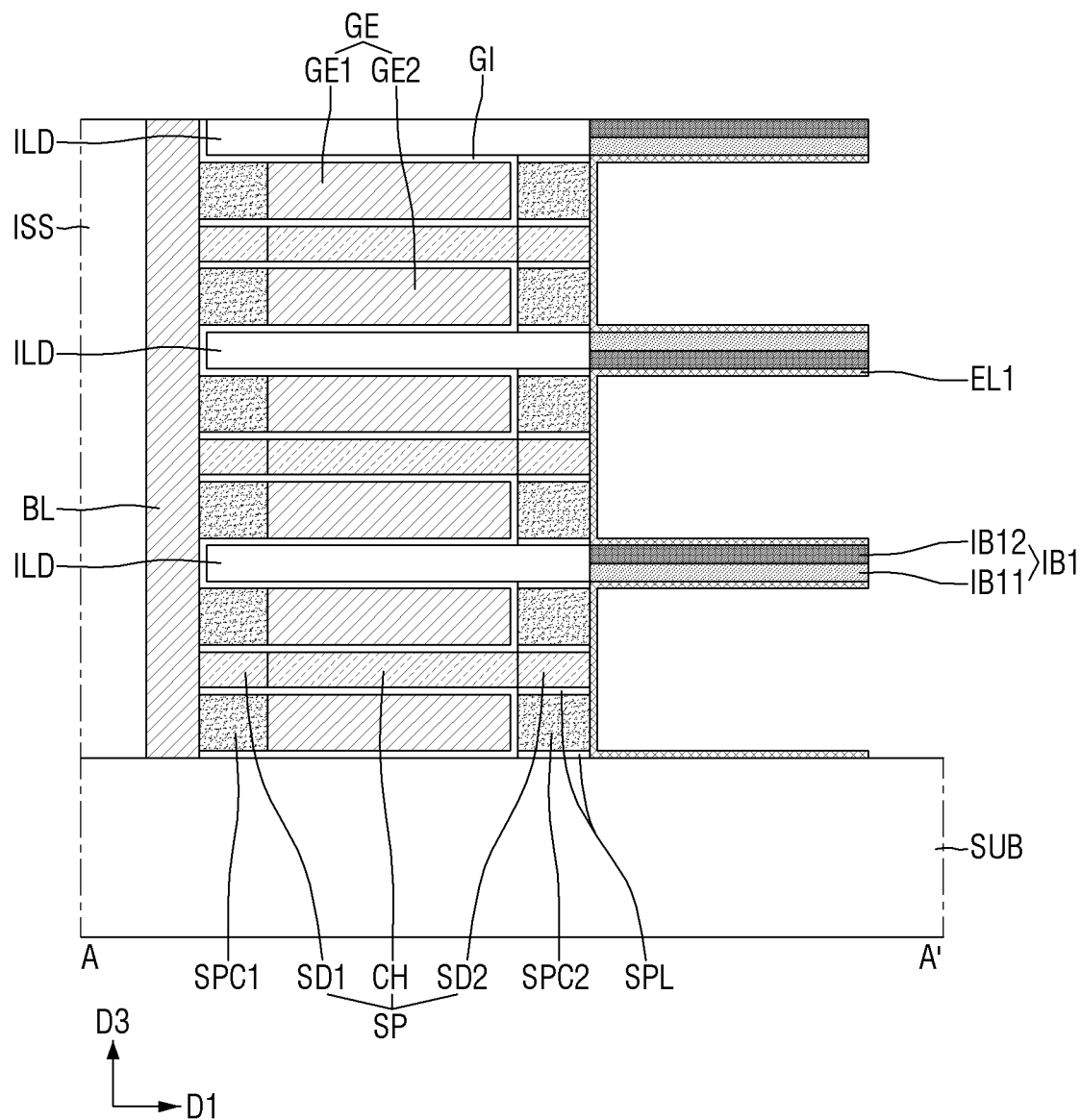
Figure 25:
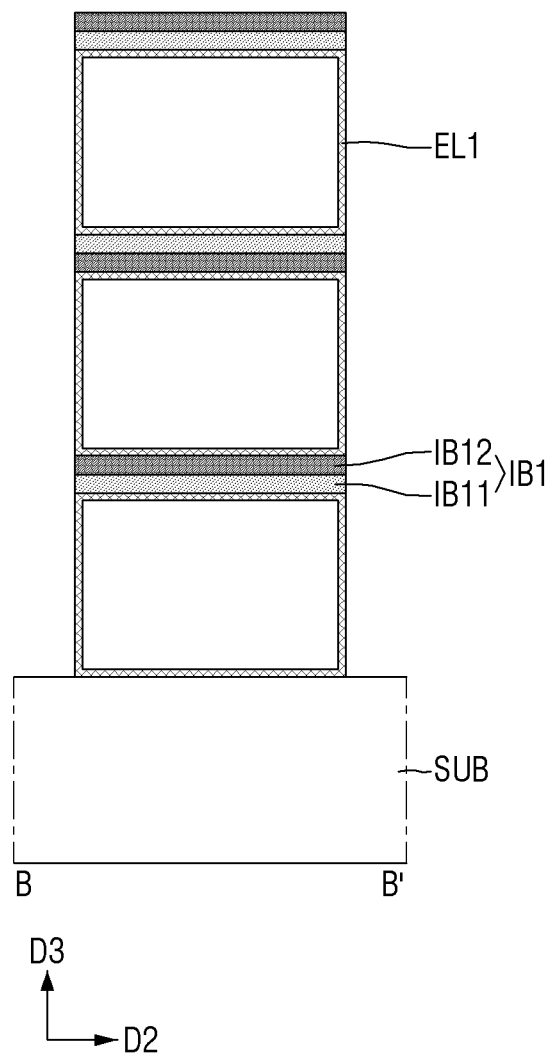

Referring to FIG. 24, the insulating buffer film IB1 may be formed in the third recess RS3. The insulating buffer film IB1 may be partially or completely filled between the first electrodes EL1 adjacent to each other in the third direction D3. As a result, the first electrode EL1 may be separated by the insulating buffer film IB1.

The insulating buffer film D31 may include a first insulating buffer film IB11 and a second insulating buffer film IB12. For example, the first pre-insulating buffer film may be formed along the outer walls of the first electrode EL1, and the second pre-insulating buffer film may be formed along the first insulating buffer film IB11. Subsequently, the remaining first and second pre-insulating buffer films except the first and second pre-insulating buffer films disposed between the first electrodes EL1 adjacent to each other in the third direction D3 may be removed. Therefore, the insulating buffer film IB1 may be formed.

The first and second pre-insulating buffer films may be removed by isotropic etching. Therefore, the side walls of the insulating buffer film IB1 in the first direction D1 and the second direction D2 may have a convex shape toward the insulating buffer film IB1.

Figure 26:
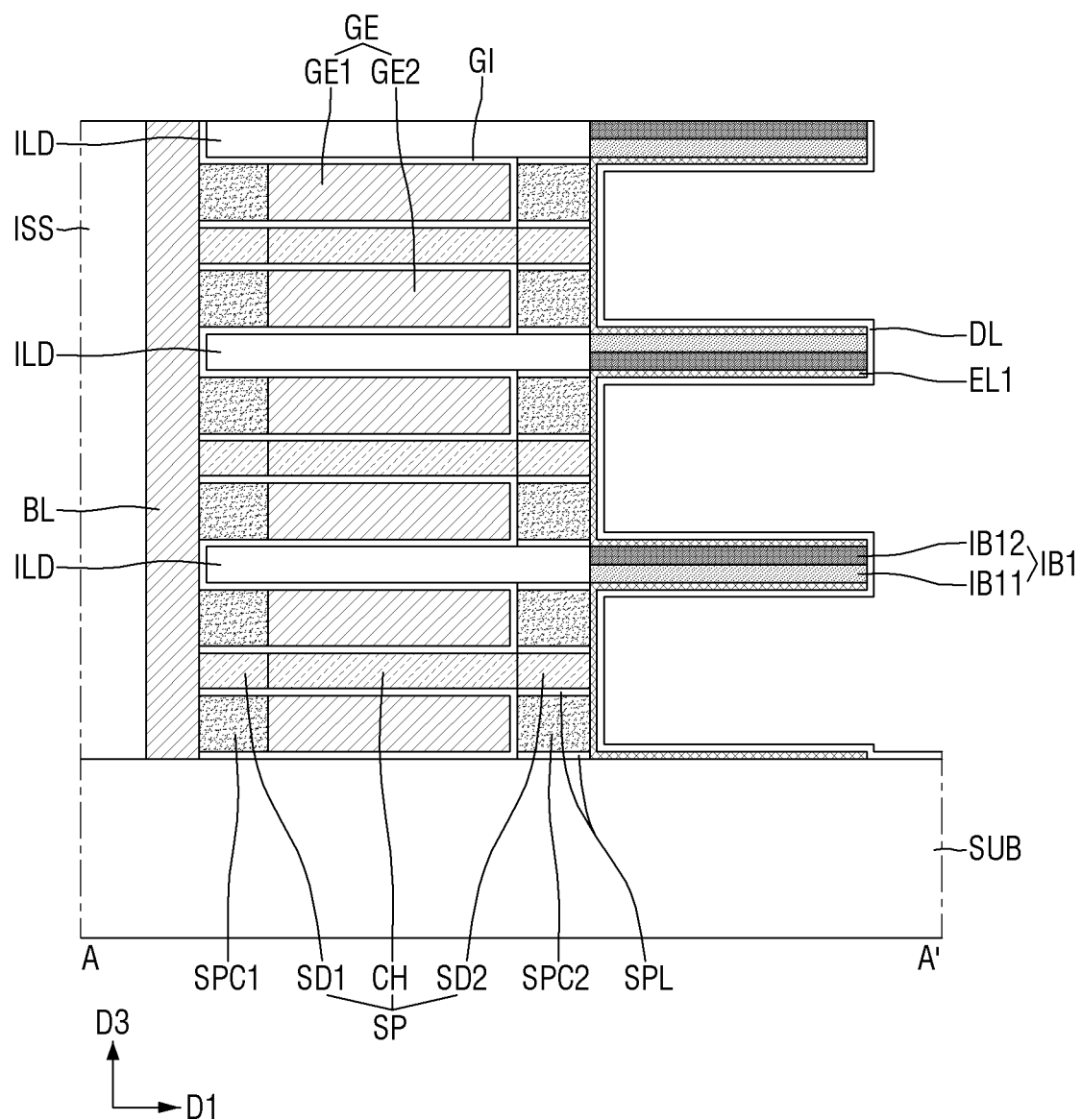
Figure 27:
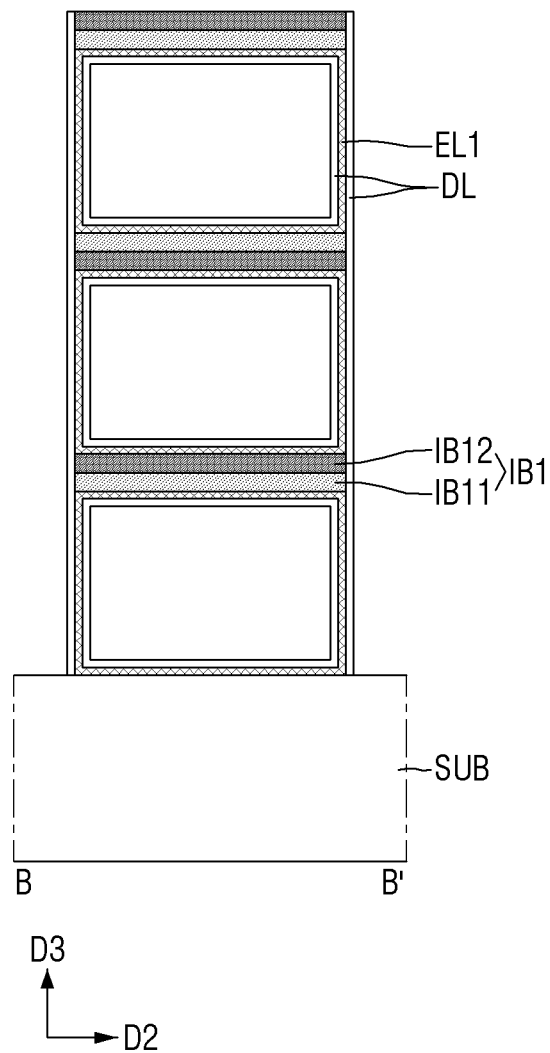

Referring to FIGS. 26 and 27, the capacitor dielectric film DL may be formed. The capacitor dielectric film DL may extend along the first electrode EL1 and the insulating buffer film IB1.

Next, referring to FIGS. 4 and 5, the second electrode EL2 that covers or overlaps the capacitor dielectric film DL may be formed. Therefore, the information storage element DS may be formed.

Figure 28:
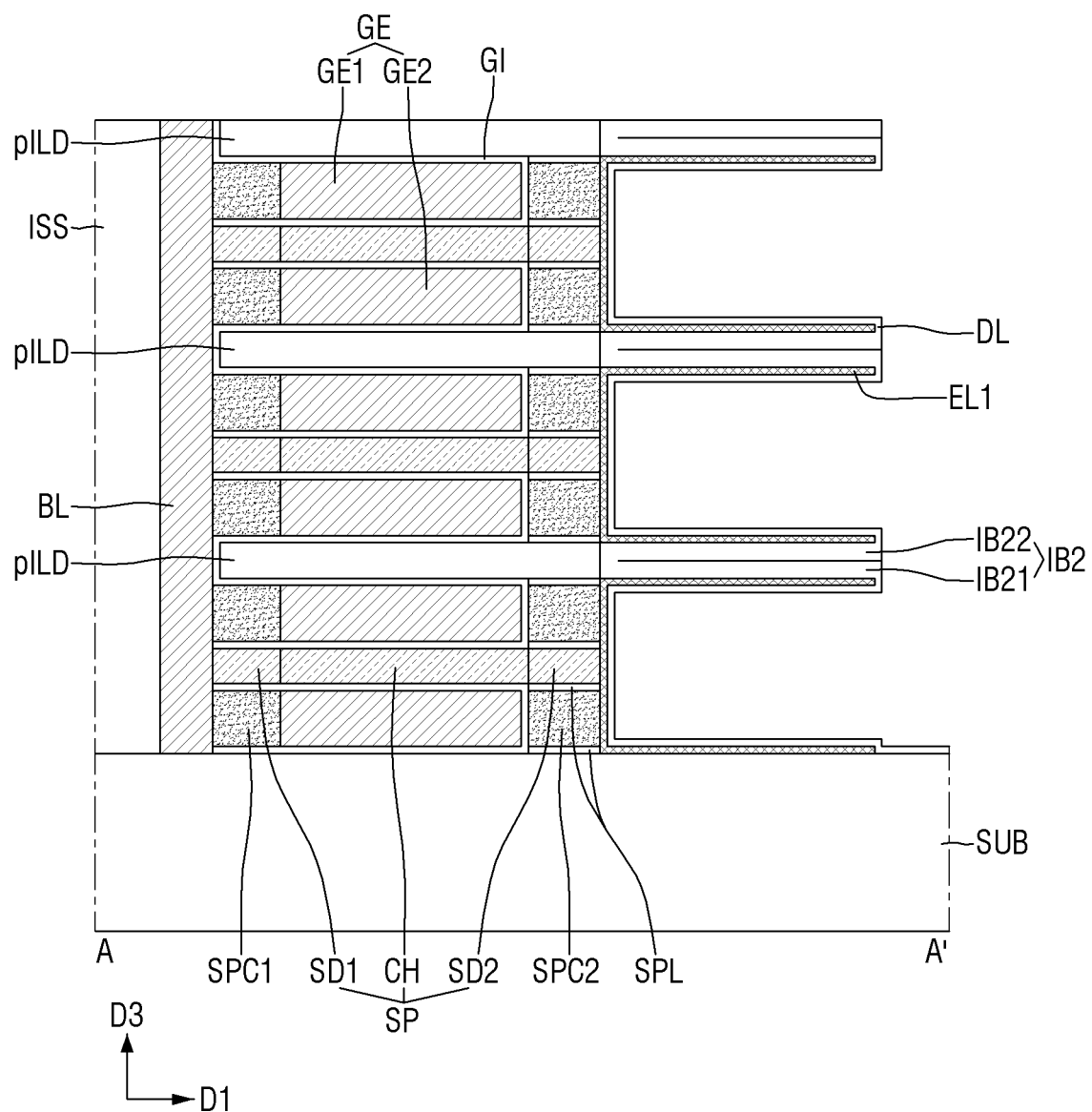
FIGS. 28 and 29 are intermediate step diagrams for explaining a method for manufacturing a semiconductor memory device according to some embodiments.
Figure 29:
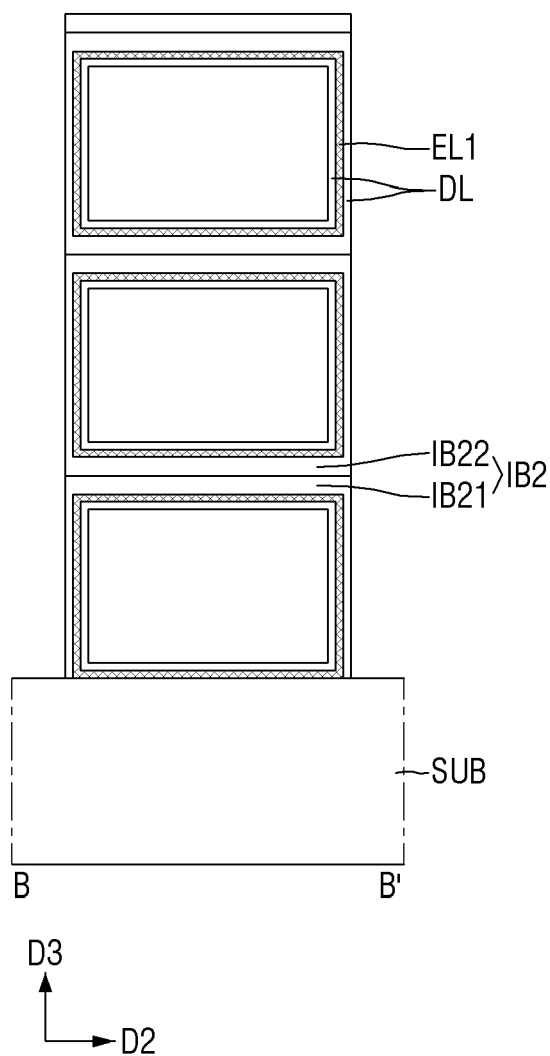

FIGS. 28 and 29 are intermediate step diagrams for explaining a method for manufacturing a semiconductor memory device according to some embodiments. FIG. 28 is a cross-sectional view taken along A-A' of FIG. 2, FIG. 29 is a cross-sectional view taken along B-B' of FIG. 2, and FIGS. 28 and 29 are diagrams subsequent to FIGS. 22 and 23.

Referring to FIGS. 28 and 29, the capacitor dielectric film DL may be formed along the second recess RS2 and the third recess RS3. The inner walls and outer walls of the first electrode EL1 and the third recess RS3 may form the capacitor dielectric film DL along the side walls of the mold insulating layer ILD.

At this time, the width of the third recess RS3 in the third direction D3 may be smaller than, for example, twice the thickness of the capacitor dielectric film DL in the third direction D3. Therefore, the capacitor dielectric film DL may partially or completely fill the third recess RS3. That is, the capacitor dielectric film DL that fills the third recess RS3 may be the insulating buffer film IB2. There may be some boundary lines between the first insulating buffer film IB21 and the second insulating buffer film IB22. For example, there may be no boundary line between the first insulating buffer film IB21 and the second insulating buffer film IB22 adjacent to the mold insulating layer ILD.

Next, referring to FIGS. 6 and 7, the second electrode EL2 that covers or overlaps the capacitor dielectric film DL and the insulating buffer film IB2 may be formed. Therefore, the information storage element DS may be formed.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense and not for purposes of limitation.

What is claimed is:

1. A semiconductor memory device comprising:
    a plurality of mold insulating layers on a substrate and spaced apart from one another in a first direction perpendicular to an upper side of the substrate;
    a plurality of semiconductor patterns which are between respective ones of the plurality of mold insulating layers adjacent to each other in the first direction, and extend in a second direction parallel to the upper side of the substrate;
    a plurality of gate electrodes that extend in a third direction different from the first direction and the second direction, on respective ones of the plurality of semiconductor patterns;
    an information storage element comprising a first electrode electrically connected to each of the plurality of semiconductor patterns, a second electrode on the first electrode, and a capacitor dielectric film between the first electrode and the second electrode;
    a bit line on the substrate, wherein the bit line extends in the first direction, and contacts the plurality of semiconductor patterns; and
    an insulating buffer film on the first electrode, wherein the insulating buffer film is on a sidewall of a respective one of the plurality of mold insulating layers.

2. The semiconductor memory device of claim 1, wherein the insulating buffer film comprises a same material as the capacitor dielectric film.

3. The semiconductor memory device of claim 1, wherein the first electrode comprises a plurality of protrusions that extend into the second electrode in the first direction.

4. The semiconductor memory device of claim 1, wherein a dielectric constant of the insulating buffer film is less than a dielectric constant of the capacitor dielectric film.

5. The semiconductor memory device of claim 1, wherein the insulating buffer film comprises a first insulating buffer film, and a second insulating buffer film on the first insulating buffer film.

6. The semiconductor memory device of claim 5, wherein the first insulating buffer film and the second insulating buffer film comprise a same material.

7. The semiconductor memory device of claim 5, wherein the first insulating buffer film and the second insulating buffer film comprise different materials from each other.

8. The semiconductor memory device of claim 1, wherein the capacitor dielectric film is between the insulating buffer film and the second electrode.

9. The semiconductor memory device of claim 1,
wherein each of the plurality of semiconductor patterns comprises a first side and a second side opposite to each other in the first direction, and
wherein each of the plurality of gate electrodes comprises a first gate electrode on the first side of a respective one of the plurality of semiconductor patterns, and a second gate electrode on the second side of the respective one of the plurality of semiconductor patterns.

10. The semiconductor memory device of claim 1,
wherein each of the plurality of semiconductor patterns comprises a first side and a second side opposite to each other in the first direction, and a third side and a fourth side opposite to each other in the third direction, and
wherein each of the plurality of gate electrodes is on the first to fourth sides of respective ones of the plurality of semiconductor patterns.

11. The semiconductor memory device of claim 1, further comprising:
a separation pattern between the first electrode on a side surface in the second direction of at least one of the plurality of semiconductor patterns and the capacitor dielectric film.

12. The semiconductor memory device of claim 11, wherein a width of the separation pattern in the second direction of the at least one of the plurality of semiconductor patterns decreases in a direction away from the substrate.

13. The semiconductor memory device of claim 1, wherein the insulating buffer film is on an outer wall of the first electrode.

14. The semiconductor memory device of claim 1, wherein ones of the plurality of gate electrodes are on both side surfaces of respective ones of the plurality of semiconductor patterns.

15. The semiconductor memory device of claim 1, wherein a first gate electrode of the plurality of gate electrodes comprises a portion whose width in the third direction increases toward the information storage element.

* * * * *